(12) United States Patent
Cauffiel et al.

(10) Patent No.: US 9,923,115 B2
(45) Date of Patent: Mar. 20, 2018

(54) PARTICLE DETECTOR AND METHOD OF MAKING THE SAME

(71) Applicant: Lithium Innovations Company, LLC, Toledo, OH (US)

(72) Inventors: Ford B. Cauffiel, Holland, OH (US); Alvin D. Compaan, Holland, OH (US); Victor V. Plotnikov, Toledo, OH (US); Ambalanath Shan, Toledo, OH (US); Anthony J. Matthews, Toledo, OH (US); Robert D. Fisher, Toledo, OH (US); Song Cheng, Flat Rock, MI (US)

(73) Assignee: Lithium Innovations Company, LLC, Toledo, OH (US)

( * ) Notice: Subject to any disclaimer, the term of this patent is extended or adjusted under 35 U.S.C. 154(b) by 0 days.

(21) Appl. No.: 15/337,798

(22) Filed: Oct. 28, 2016

(65) Prior Publication Data
US 2017/0125625 A1 May 4, 2017

Related U.S. Application Data

(60) Provisional application No. 62/248,600, filed on Oct. 30, 2015.

(51) Int. Cl.
*H01L 31/115* (2006.01)
*H01L 31/0368* (2006.01)
(Continued)

(52) U.S. Cl.
CPC .............. *H01L 31/115* (2013.01); *G01T 3/08* (2013.01); *H01L 31/0296* (2013.01);
(Continued)

(58) Field of Classification Search
CPC .............. H01L 31/115; H01L 31/0368; H01L 31/0296; H01L 31/02161; H01L 31/03529; H01L 31/022408; G01T 3/08
See application file for complete search history.

(56) References Cited

U.S. PATENT DOCUMENTS

| | | |
|---|---|---|
| 5,117,114 A | 5/1992 | Street et al. |
| 5,131,954 A | 7/1992 | Vogeli et al. |

(Continued)

OTHER PUBLICATIONS

Chung, Hugh E., Radiation Detection and Imaging: Neutrons and Electric Fields, Thesis, Aug. 2015, 142 pages, Arizona State University, Arizona, USA.

(Continued)

*Primary Examiner* — Roy Potter
(74) *Attorney, Agent, or Firm* — Marshall & Melhorn, LLC

(57) ABSTRACT

A particle detector includes a support member. A front electrode layer is disposed over the support member. A semiconductor heterojunction is disposed over the front electrode layer. The semiconductor heterojunction has at least a polycrystalline n-type layer and at least a polycrystalline p-type layer. A back electrode layer is disposed over the semiconductor heterojunction. The back electrode includes at least one removed portion that separates a first portion of the back electrode layer from a second portion of the back electrode layer. The particle detector also includes a first body of electrically insulating material which separates a first portion of the semiconductor heterojunction from a second portion of the semiconductor heterojunction. The first body of electrically insulating material also separates a first portion of the front electrode layer from a second portion of the front electrode layer.

16 Claims, 18 Drawing Sheets

(51) Int. Cl.
  *H01L 31/0296* (2006.01)
  *H01L 31/0216* (2014.01)
  *H01L 31/0352* (2006.01)
  *H01L 31/0224* (2006.01)
  *G01T 3/08* (2006.01)

(52) U.S. Cl.
  CPC ............ *H01L 31/02161* (2013.01); *H01L 31/022408* (2013.01); *H01L 31/0368* (2013.01); *H01L 31/03529* (2013.01)

(56) References Cited

U.S. PATENT DOCUMENTS

| | | | |
|---|---|---|---|
| 5,940,460 | A | 8/1999 | Seidel et al. |
| 8,022,369 | B2 | 9/2011 | Orava et al. |
| 8,569,708 | B2 | 10/2013 | Stradins et al. |
| 9,029,792 | B2 | 5/2015 | Stradins et al. |
| 9,590,128 | B2 * | 3/2017 | Cauffiel ............ H01L 31/115 |
| 2005/0258372 | A1 | 11/2005 | McGregor et al. |
| 2009/0302226 | A1 | 12/2009 | Schieber et al. |
| 2011/0163242 | A1 | 7/2011 | Mao et al. |
| 2013/0015363 | A1 | 1/2013 | Orava et al. |
| 2013/0292685 | A1 | 11/2013 | Jiang et al. |
| 2015/0287872 | A1 | 10/2015 | Cauffiel et al. |

OTHER PUBLICATIONS

Dahal, R. et al. Self-powered micro-structured solid state neutron detector with very low leakage current and high efficiency; Applied Physics Letters; Jun. 15, 2012, pp. 243507-1 to 243507-4; 100.

Danon, Yaron et al. Development of a Self Biased High Efficiency Solid-State Neutron Detector for MPACT Applications; Nuclear Energy University Programs (NEUP), U.S. Department of Energy, Project No. 10-852; 2013.

Inglis, Andrew et al. Glass-Panel 6Li Neutron Detector; 2012 IEEE Conference on Technologies for Homeland Security; 2012, pp. 429-434.

Kouzes, Richard T. et al. Alternatives to 3He for Neutron Detection for Homeland Security, Pacific Northwest National Laboratory Report; 2009; PNNL Report-18471; Richland, Washington.

Kouzes, Richard T. et al. Neutron Detector Gamma Insensitivity Criteria; Pacific Northwest National Laboratory; Oct. 28, 2009; PNNL-18903; Richland, Washington.

Kouzes, Richard T. et al. Passive neutron detection for interdiction of nuclear material at borders; Nuclear Instruments and Methods in Physics Research A 584; 2008; pp. 383-400.

Majety, S. et al.: Metal-semiconductor-metal neutron detectors based on hexagonal boron nitride epitaxial layers; Published in SPIE Proceedings Hard X-Ray, Gamma-Ray, and Neutron Detector Physics XIV, vol. 8507, 85070R, Oct. 24, 2012; Downloaded From: http://proceedings.spiedigitallibrary.org/ on Oct. 30, 2012.

McGregor, D. S. et al. Design considerations for thin film coated semiconductor thermal neutron detectors—I: basics regarding alpha particle emitting neutron reactive films; Nuclear Instruments and Methods in Physics Research A 500; 2003; pp. 272-308.

McGregor, D. S. et al; Present status of microstructured semiconductor neutron detectors; Journal of Crystal Growth; Feb. 21, 2013, pp. 99-110; 379.

McGregor, D. S. et al; Room-temperature compound semiconductor radiation detectors; Nuclear instruments and Methods in Physics Research A 395; 1997; pp. 101-124.

McGregor, D. S. et al; Semi-insulating bulk GaAs as a semiconductor thermal-neutron imaging device; Nuclear Instruments and Method in Physics Research A 380; 1996; pp. 271-275.

McGregor, D. S. et al; Thermal neutron detection with cadmium1-x zincx telluride semiconductor detectors; Nuclear Instruments and Methods in Physics Research A 381; 1996; pp. 498-501.

Mibrath, B. D. et al; Radiation detector materials: An overview; Journal of Materials Research; Oct. 2008; pp. 2561-2581; vol. 23.

Murphy, John W., et al.; Thin Film Cadmium Telluride Charged Particle Sensors for Large Area Neutron Detectors, Applied Physics Letters, Sep. 19, 2014, 5 Pages, Erik Jonsson School of Engineering and Computer Science, UT Dallas, Eugene Mcdermott Library, AIP Publishing LLC, USA.

Nelson, Kyle A. et al; Characterization of a mid-sized Li foil multi-wire proportional counter neutron detector; Nuclear Instruments and Methods in Physics Research A 762; 2014; pp. 119-124.

Nelson, Kyle A. et al; Investigation of a lithium foil multi-wire proportional counter for potential 3He replacement; Nuclear Instruments and Method in Physics Research A 669; 2012; pp. 79-84.

Rossa, E. et al; New Development of a Radiation-Hard Polycrystalline CdTe Detector for LHC Luminosity Monitoring; Proceedings DIPAC 2001; CT11; pp. 94-96; ESRF, Grenoble, France.

Unruh, Troy C. et al.; Design and operation of a 2-D thin-film semiconductor neutron detector array for use as a beamport monitor; Nuclear Instruments and Methods in Physics Research A; 2009.01.087.

* cited by examiner

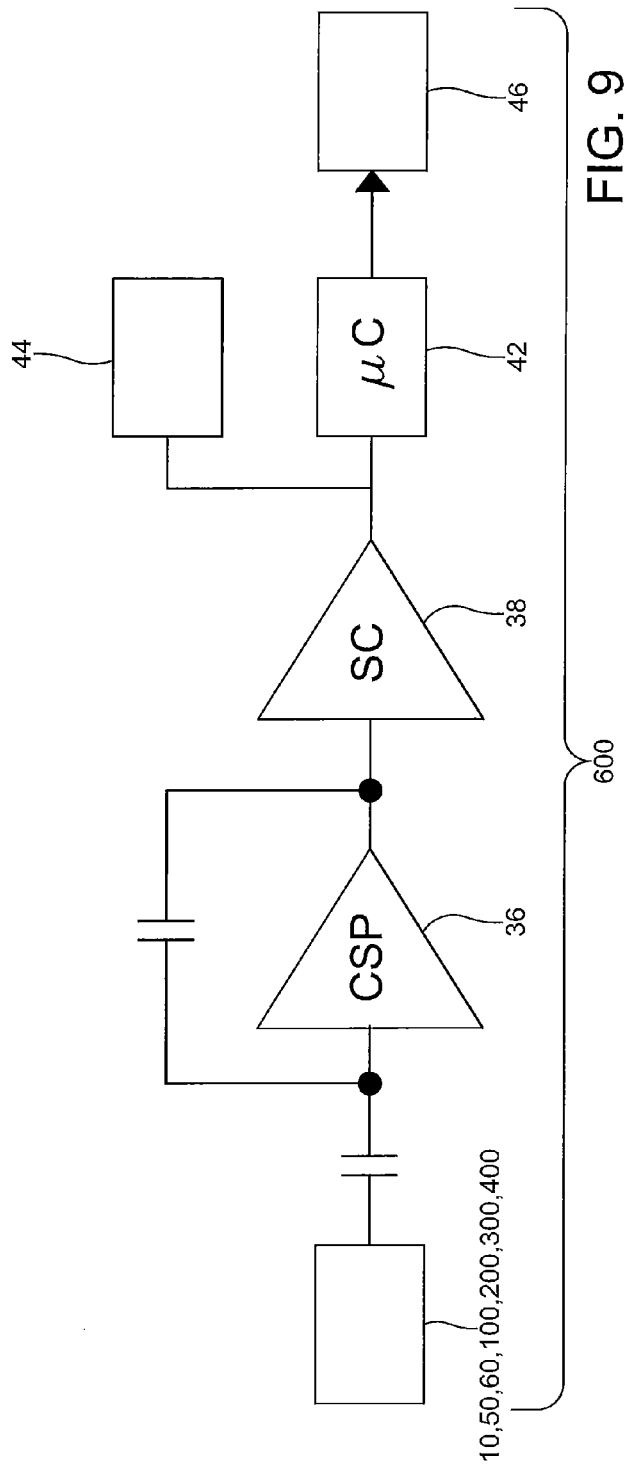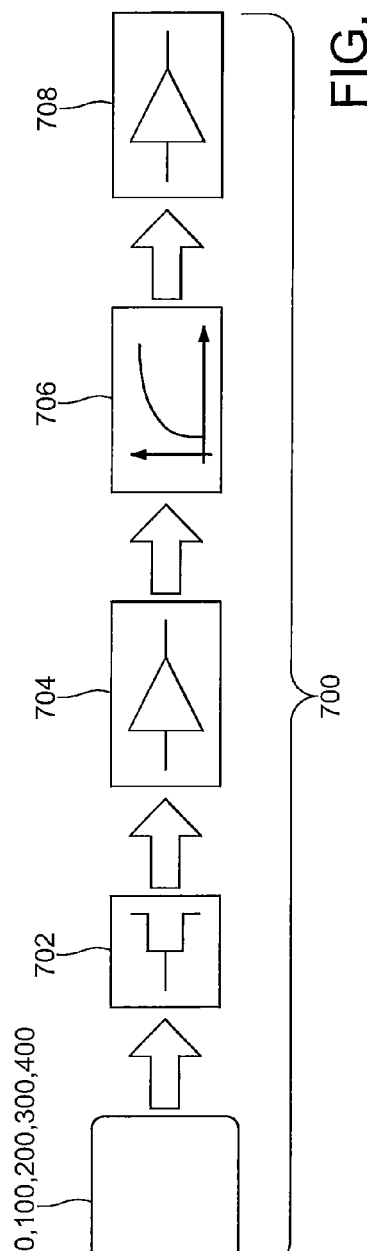

PARTICLE DETECTOR AND METHOD OF MAKING THE SAME

CROSS-REFERENCE TO RELATED APPLICATION

This application is claiming the benefit, under 35 U.S.C. 119(a), of the U.S. patent application which was granted Ser. No. 62/248,600 and filed on Oct. 30, 2015, the entire disclosure of which is hereby incorporated by reference.

STATEMENT REGARDING FEDERALLY SPONSORED RESEARCH OR DEVELOPMENT

This invention was made with government support under the contract HSHQDC-15-C-00007 awarded by the Department of Homeland Security. The government has certain rights in the invention.

BACKGROUND OF THE INVENTION

The invention relates to a thin-film semiconductor particle detector. The invention also relates to a method of detecting particles.

Each year millions of freight containers are unloaded at almost 400 U.S. seaports. Additionally, there are nearly 1 million public and private airplane flights landing on U.S. soil and 11 M trucks and 2 M rail cars that enter the U.S. from Canada and Mexico each year. Also, there are about 50 vehicle border crossings to the U.S. with typically 5-10 traffic lanes. Particle detectors such as, for example, neutron detectors are currently used at seaports, airports, rail yards and border crossings to scan for contraband special nuclear material (SNM) and to prevent terrorists from smuggling said material, e.g., a fission bomb or fissionable material, into the U.S. Fissioning nuclei generally emit neutrons of many different energies but most of these neutrons rapidly lose energy and reach kinetic energies typical of the surrounding material. These "thermal" neutrons have kinetic energies approximately equal to a $k_B T$ of ~25 meV where $k_B$ is the Boltzmann constant and T is room temperature. Detection of thermal neutrons is typically the most important. Scanning each freight container, airplane, truck, rail car and vehicle that enters the U.S. would require thousands of neutron detectors.

One of the most common large-area detectors for thermal neutrons employs He-3 isotopically enriched gas in a cylindrical tube proportional counter. Alternatively, a multiwire proportional counter (MWPC) may be used with He-3. However, there is a serious shortage of the He-3 isotope while the demand continues to rise for detectors of special nuclear material (SNM) at U.S. ports and in foreign locations. Except for gaseous He-3, which has a very large thermal neutron cross section and can serve as the main component of a proportional counter, most neutron detectors need a separate neutron activation layer which includes a material that has a high concentration of an isotope with a large thermal neutron absorption cross-section. Such isotopes include He-3, Li-6, B-10, and Cd-113. These isotopes not only capture slow or thermal neutrons, but then emit high energy charged particles that are easier to detect.

One type of nuclear particle detector is based on gas discharge proportional counters or those operating in the Geiger discharge region and called Geiger tubes. For large-area detectors, these may take the form of a multiwire proportional detector or may use an array of tubular structures. If they are not filled with He-3 gas, they typically need a neutron activation material in addition to the gas for the proportional detector. These proportional counters typically operate at 1000 V or higher, are bulky, and are sensitive to pressure and temperature changes. Another common detector type is designed around a scintillator material, either solid or liquid, that emits bursts of light when a charged particle passes through it. This light is then detected by a photomultiplier or other photon detector. The scintillator light is usually emitted in the near UV or visible range of wavelengths. Scintillator detectors are also typically bulky, complex and can be very sensitive to gamma-ray background counts.

Yet another type of detector is based on a high purity, single crystal semiconductor together with one of the activating isotopes. In this case, the high-energy charged particles produced by the neutron activator material will directly generate a large number of electron-hole pairs in the semiconductor as the charged particle passes through the semiconductor. These electrons and holes are collected in the same semiconductor, usually by applying a strong external voltage to create an electric field in the semiconductor which separates the electrons and holes and sweeps them to the positive and negative electrodes. Unlike the scintillator crystal, particle detection occurs entirely in one detector structure. In most cases, the semiconductor material must be from 1 to 10 mm thick.

One frequent limitation of the semiconductor detector is that usually high-quality single crystals are needed in order to obtain a high probability of collection of the generated charge carriers. Due to the limited size available for most high quality single crystals, achieving large-area detection from single-crystal materials then requires assembling an array of smaller crystals which significantly increases the costs. Additionally, effective use of the neutron activation material and the semiconductor often requires that the semiconductor be microstructured with pores or grooves to accommodate the neutron activator layers leading to high fabrication cost. A further limitation of this type of neutron detector is its sensitivity to radiation damage from radiation that pervades many environments in which the detector is to be used which degrades the performance of the detector over time. In addition, the large semiconductor volume leads to sensitivity to gamma-ray background noise and the large junction interfacial area leads to high capacitance, large leakage currents and high electronic noise in the detector.

Furthermore, the aforementioned particle detectors are typically bulky and difficult to use. If the footprint for and portability of the detectors were improved, security at seaports, airports, rail yards, and border crossings would increase. Additionally, if such improvements to particle detectors were made, demand for the detectors in other applications and industries would increase. For example, demand for a particle detector with the capability to detect neutrons utilized in down-hole well-logging applications in the oil and gas industry would increase if the aforementioned improvements were made.

Thus, it would be desirable to provide a particle detector that addresses the deficiencies described above. It would also be desirable to provide a method of making such detectors.

BRIEF SUMMARY OF THE INVENTION

Embodiments of a particle detector are provided.

In an embodiment, the particle detector comprises a support member. A front electrode layer is disposed over the support member. A semiconductor heterojunction is disposed over the front electrode layer. The semiconductor heterojunction has at least a polycrystalline n-type layer and at least a polycrystalline p-type layer. A back electrode layer is disposed over the semiconductor heterojunction. The back electrode comprises at least one removed portion that separates a first portion of the back electrode layer from a second portion of the back electrode layer. The particle detector also comprises a first body of electrically insulating material which separates a first portion of the semiconductor heterojunction from a second portion of the semiconductor heterojunction. The first body of electrically insulating material also separates a first portion of the front electrode layer from a second portion of the front electrode layer.

BRIEF DESCRIPTION OF THE SEVERAL VIEWS OF THE DRAWING

The above, as well as other advantages of the present invention will become readily apparent to those skilled in the art from the following detailed description when considered in the light of the accompanying drawings in which:

FIG. 9 is an electrical schematic diagram of an embodiment of a particle detector assembly in accordance with the invention;

FIG. 10 is an electrical schematic diagram of another embodiment of a particle detector assembly in accordance with the invention;

DETAILED DESCRIPTION OF THE INVENTION

Figure 1:
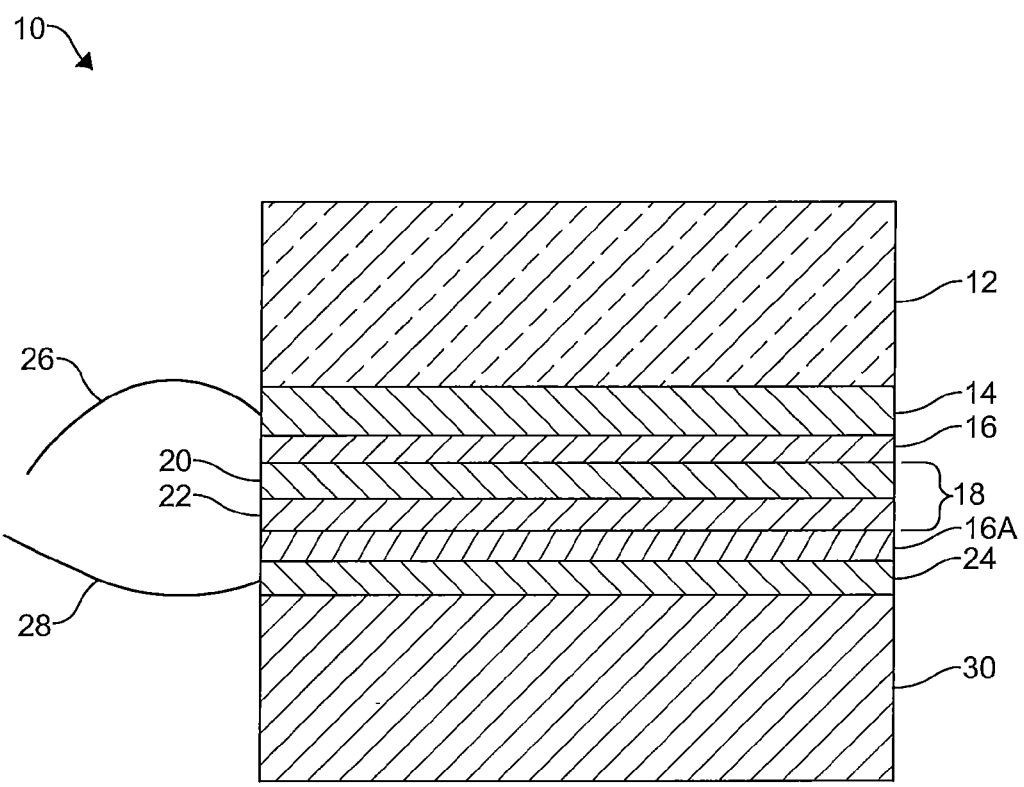
FIG. 1 is a cross-sectional view of an embodiment of a particle detector in accordance with the invention.

It is to be understood that the invention may assume various alternative orientations and step sequences, except where expressly specified to the contrary. It is also to be understood that the methods, assemblies and features illustrated in the attached drawings, and described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in various embodiments described herein may be commonly referred to with like or similar reference numerals within this section of the application.

Referring now to the figures, embodiments of a particle detector 10, 50, 60, 100, 200, 300, 400 are described below. It would be understood by one of ordinary skill in the art that the particle detector 10, 50, 60, 100, 200, 300, 400 and method described herein have many applications including, but not limited to, applications for scanning freight and other types of containers. Furthermore, it would be understood by one of ordinary skill in the art that the embodiments could have passenger vehicle, commercial vehicle, industrial, locomotive, naval and aerospace applications. Additionally, certain embodiments of the invention could have applications in personal protective equipment. Also, certain embodiments of the invention may have applications in high radiation environments such as in neutron multiplicity counting.

The particle detector 10, 50, 60, 100, 200, 300, 400 is highly insensitive to gamma radiation, which is desired in many situations. For example, the particle detector 10, 50, 60, 100, 200, 300, 400 has a sensitivity of <1.0×10$^{-6}$ or less than one gamma detected per one million incident gammas. More preferably, in certain embodiments, the particle detector 10, 50, 60, 100, 200, 300, 400 has a sensitivity of less than 3.0×10$^{-8}$ or about three gammas detected per hundred million incident gammas.

Further, the particle detector 10, 50, 60, 100, 200, 300, 400 may be of a rugged, durable configuration that is resistant to radiation damage. Additionally, the particle detector 10, 50, 60, 100, 200, 300, 400 may be compact, thin, and have low power consumption. Such qualities make the embodiments of the particle detector 10, 50, 60, 100, 200, 300, 400 well-suited for use in a variety of portable radiation monitor applications such as, for example, use in hand-held, backpack, aerial/drone and robotic devices. Additionally, the particle detector 10, 50, 60, 100, 200, 300, 400 can be formed from light-weight materials that are scalable for use as a large area detector and fabricated by low cost manufacturing methods. Other advantages found in certain embodiments of the particle detector 10, 50, 60, 100, 200, 300, 400 will be described below.

Referring now to FIG. 1, the particle detector 10 comprises a support member 12. The support member 12 provides mechanical support for the other portions of the particle detector 10. The support member 12 may be provided as either a superstrate or substrate when forming certain portions of the particle detector 10. Preferably, the support member 12 is of a sufficient thickness and rigidity to provide mechanical support for those portions of the detector. In an embodiment, the thickness of the support member 12 is 3 millimeters (mm) or less. Preferably, the thickness of the support member 12 is 1 mm or less. More preferably, the thickness of the support member 12 is about 0.1 mm. In certain embodiments, the support 12 member is of a thickness from about 25 microns to about 3000 microns. Further, in certain embodiments, the support member is of a thickness which allows the member to be flexible so that it can be formed into a desired shape. However, it is preferred that the support member 12 is of a thickness which is greater than the thickness of the remaining layers in the particle detector 10.

In certain embodiments, the support member 12 is comprised of a ceramic material such as glass. In these embodiments, it may be preferable to use glass having a silicate composition such as, for example, a borosilicate composition. A preferred glass having a borosilicate composition and suitable for use as the support member 12 is manufactured by Corning and sold under the trademark Willow® Glass. However, small quantities of boron-10 in borosilicate glass create some limitations due to neutron absorption. Thus, in certain embodiments, the support member 12 may be of a composition that is not more than 1% boron. The support member may comprise glass having a soda-lime-silica composition or another composition. In another embodiment, the support member 12 is comprised of a polymer such as, for example, polyimide. In yet another embodiment (not depicted), the support member 12 is metallic. In this embodiment, the support member 12 may comprise aluminum or molybdenum and be formed in a unitary manner with a back electrode layer 24.

A front electrode layer 14 is disposed over the support member 12. In an embodiment, the front electrode layer 14 is disposed directly on the support member 12. The front electrode layer 14 has a sheet resistance of 100 ohms per square (ohm/square) or less. Preferably, the front electrode layer 14 has a sheet resistance of between 5 and 100 ohm/square. More preferably, the front electrode layer 14 has a sheet resistance of between about 5 and 20 ohm/square. In certain embodiments, the front electrode layer 14 comprises a transparent conductive oxide (TCO). In these embodiments, the TCO may comprise ZnO:Al (AZO), $SnO_2$:F (FTO), $In_2O_3$:Sn (ITO), CdO, $Cd_2SnO_4$, or InZrO (IZO). In another embodiment, the front electrode layer 14 comprises ZnS. In other embodiments, the front electrode layer(s) may comprise other materials.

A high resistivity buffer layer 16, 16A may be disposed over the front electrode layer 14 and/or a semiconductor junction 18. In an embodiment, the high resistivity buffer layer 16 is disposed directly on the front electrode layer 14. In another embodiment, the high resistivity buffer layer 16A is disposed directly on the semiconductor junction 18. In yet another embodiment, a first high resistivity buffer layer 16 is disposed directly on the front electrode layer 14 and a second high resistivity buffer layer 16A is disposed directly on the semiconductor junction 18. Preferably, the high resistivity buffer layer 16, 16A has a sheet resistance of 100 ohm/square or more. More preferably, the high resistivity buffer layer 16, 16A has a sheet resistance of between about 1000 to 100,000 ohm/square. When the high resistivity buffer layer 16 is disposed directly on the front electrode layer 14, the high resistivity buffer layer 16 has a resistivity that is greater than the front electrode layer 14. Preferably, the resistivity of the high resistivity buffer layer 16 is about 1000 times greater than the resistivity of the front electrode layer 14. When the high resistivity buffer layer 16A is disposed directly on the semiconductor junction 18, the high resistivity buffer layer 16A has a resistivity that is greater than the semiconductor junction 18. In certain embodiments, the high resistivity buffer layer 16 comprises at least one of ZnO (ZO), $SnO_2$ (TO), ZnS, CdO, and $Zn_2SnO_4$.

The semiconductor junction 18 is disposed over the front electrode layer 14. In an embodiment, the semiconductor junction 18 is disposed over the front electrode layer 14 and directly on the high resistivity buffer layer 16. In another embodiment, like the one illustrated in FIG. 3, semiconductor junction 18 is disposed directly on the front electrode layer 14.

Referring back to FIG. 1, the semiconductor junction 18 has at least an n-type layer 20 and at least a p-type layer 22. In an embodiment, semiconductor junction 18 comprises cadmium telluride (CdTe), copper indium gallium diselenide (CIGS), copper zinc tin selenide (CZTS) or is an organic such as polyphenylene vinylene (PPV) or another conjugated system. In another embodiment, the semiconductor junction 18 comprises a polycrystalline n-type layer and a polycrystalline p-type layer. In this embodiment, the semiconductor junction 18 may consist of the aforementioned polycrystalline layers. However, in another embodiment (not depicted), the semiconductor junction includes an i-type layer. In one such embodiment, the i-type layer is a nearly intrinsic semiconductor layer of CdTe that is not intentionally doped or has only a small amount of a p-type dopant. Preferably, the semiconductor junction 18 is a heterojunction where the polycrystalline n-type layer is CdS and the polycrystalline p-type layer is CdTe. In these embodiments, the semiconductor junction 18 may consist of polycrystalline layers of CdS and CdTe. However, in another embodiment (not depicted), the semiconductor junction may be a homojunction.

In the aforementioned embodiments, the front electrode layer 14 serves as an emitter facilitating good electron transport out of the n-type layer 20 and the back electrode layer 24 provides hole transport out of the p-type layer 22. The back electrode layer 24 is disposed over the semiconductor junction 18. When a polycrystalline CdS/CdTe heterojunction is provided, it is preferable that the heterojunction has been exposed to a $CdCl_2$ treatment in the presence of oxygen ($O_2$) gas in the temperature range from about 330° C. to about 450° C. after forming the layers of CdS and CdTe.

Utilizing a polycrystalline CdS/CdTe heterojunction provides an electric field within the particle detector 10. The internal electric field is about 3,000 V/cm and extends across the semiconductor junction 18. When electron-hole pairs are generated, the electric field separates the pairs out of, for example, the CdTe layer so that charge collection can occur. Separating the electron-hole pairs allows electrons of the electron-hole pairs to be collected at the front electrode layer 14 and holes of the electron-hole pairs to be collected at the back electrode layer 24. In embodiments where a heterojunction is provided, the charge collection is about 100%. Thus, in certain embodiments, the particle detector 10 is self-biasing and does not require utilizing an externally applied bias. However, if desired, an external applied bias can be utilized. For example, an external reverse bias voltage can be applied to the semiconductor junction 18 to increase carrier collection and shorten the transport time for the carrier collection. In contrast to detectors having crystals or wafers of semiconductors of about 1 mm or more in thickness, the particle detector 10 described herein requires a reverse bias of only 1 to 10 volts to increase the internal field to about 10,000 V/cm.

Figure 2:
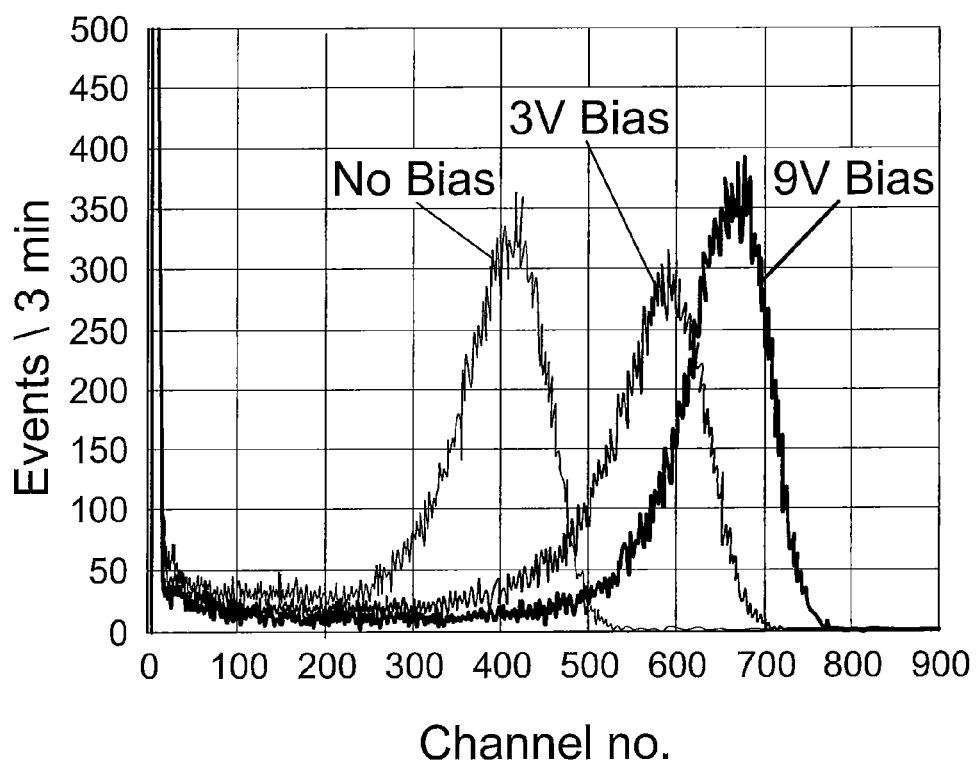
FIG. 2 is a histogram of pulse heights produced by 5.5 MeV alpha particles incident on an embodiment of the particle detector in accordance with the invention when a reverse bias of 0V, 3V, and 9V is applied.

An example of the change in the response of the particle detector 10, having a CdS/CdTe heterojunction, when an applied reverse bias is provided is illustrated in FIG. 2. It should be noted that the responses illustrated in FIG. 2 were for an embodiment of the particle detector that did not have a neutron activation layer. The particle detector had an area 0.35 cm$^2$. Also, for this embodiment, the CdS layer had a thickness of 250 nm and the CdTe layer had a thickness of 10 microns. The pulses shown were produced by incident 5.5 MeV alpha particles provided from an Am-241 source. As illustrated, good charge collection occurs with no applied bias but increased pulse heights occur with applied biases of 3V and 9V.

Referring back to FIG. 1, the back electrode layer 24 is disposed over the semiconductor junction 18. In an embodiment, the back electrode layer 24 comprises gold, copper, or another sufficiently conductive metal. The back electrode layer 24 has a thickness that is sufficiently thin that it permits charged particles, including protons, alpha particles, and tritons, with energies in the range from about 0.1 MeV to about 5 MeV to enter the semiconductor junction 18. Preferably, the thickness of the back electrode layer 24 is 20 nanometers (nm) or less. More preferably, the thickness of the back electrode layer 24 is between 2 and 20 nm. Even more preferably, the back electrode layer 24 comprises gold and has a thickness of between 10 to 15 nm.

A first electrical connection 26 is attached to the front electrode layer 14 and is in electrical communication therewith. A second electrical connection 28 is attached to the back electrode layer 24 and is in electrical communication therewith. The first electrical connection 26 and the second electrical connection 28 allow the signal produced by the particle detector 10 to be communicated and fed to another particle detector and/or a circuit provided as a portion of a particle detector assembly. A signal indicates that particles have stopped in or have passed through the semiconductor junction 18.

In certain embodiments, the particle detector 10 may be configured to detect neutrons. In these embodiments, a neutron activation layer 30 is disposed over the back electrode layer 24. In certain embodiments, the neutron activation layer 30 may be disposed directly on the back electrode layer 24. The neutron activation layer 30 can be deposited, printed, or painted over and on the back electrode layer 24.

If the neutron activation layer 30 is directly disposed, e.g., by vacuum evaporation deposition, on the back electrode layer 24, the elements in the neutron activation layer 30 such as, for example, lithium may diffuse into the detector and degrade the performance. Advantageously, in certain embodiments, like the ones illustrated in FIGS. 3 and 4, the particle detector 50, 60 is provided with one or more diffusion barriers 40, 40A which are utilized to inhibit this diffusion.

Figure 3:
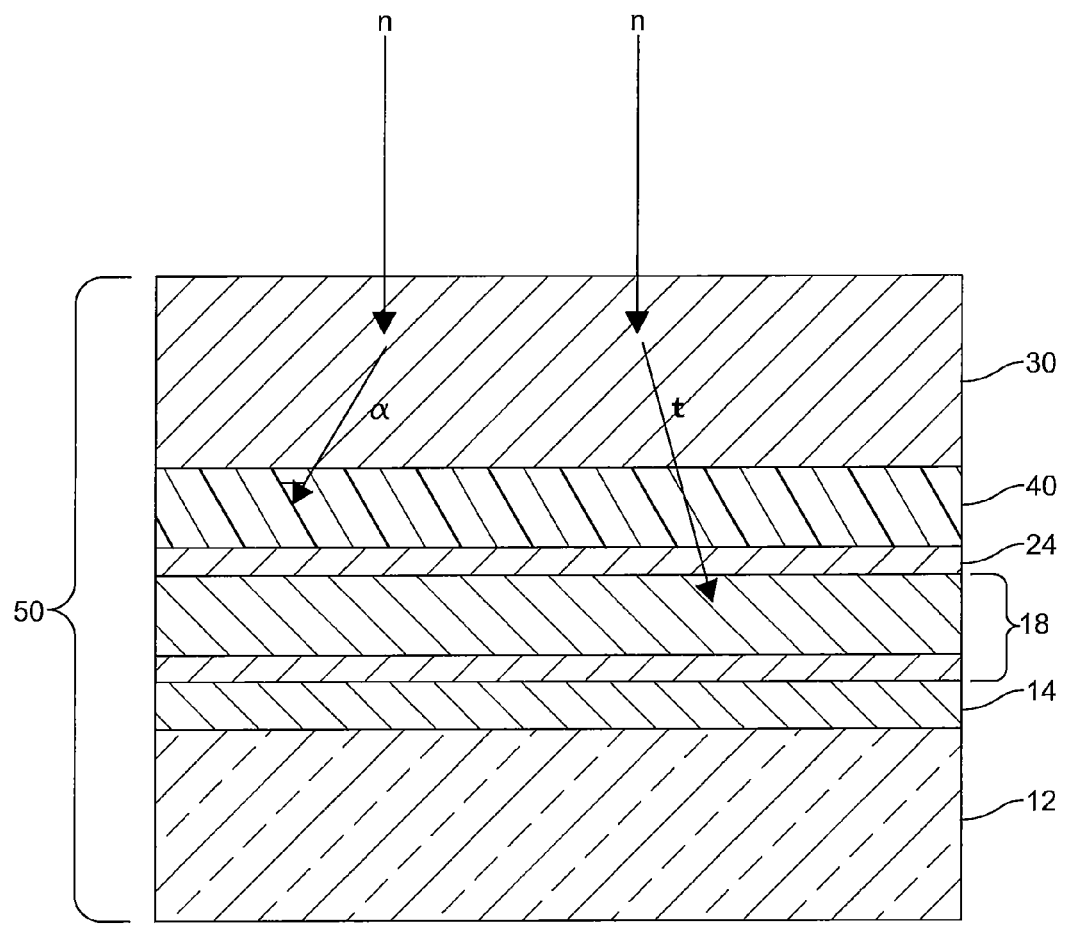
FIG. 3 is a cross-sectional view of another embodiment of a particle detector in accordance with the invention.

In the embodiment illustrated in FIG. 3, the particle detector 50 comprises a first support member 12. A first front electrode layer 14 is disposed over the first support member 12. A first semiconductor junction 18 having at least an n-type layer and at least a p-type layer is disposed over the first front electrode layer 14. A first back electrode layer 24 is disposed over the first semiconductor junction 18. Further, in this embodiment, a first diffusion barrier 40 is disposed over the first back electrode layer 24. When the first diffusion barrier 40 is provided, the neutron activation layer 30 is disposed over the first back electrode layer 24 and on the first diffusion barrier 40.

Figure 4:
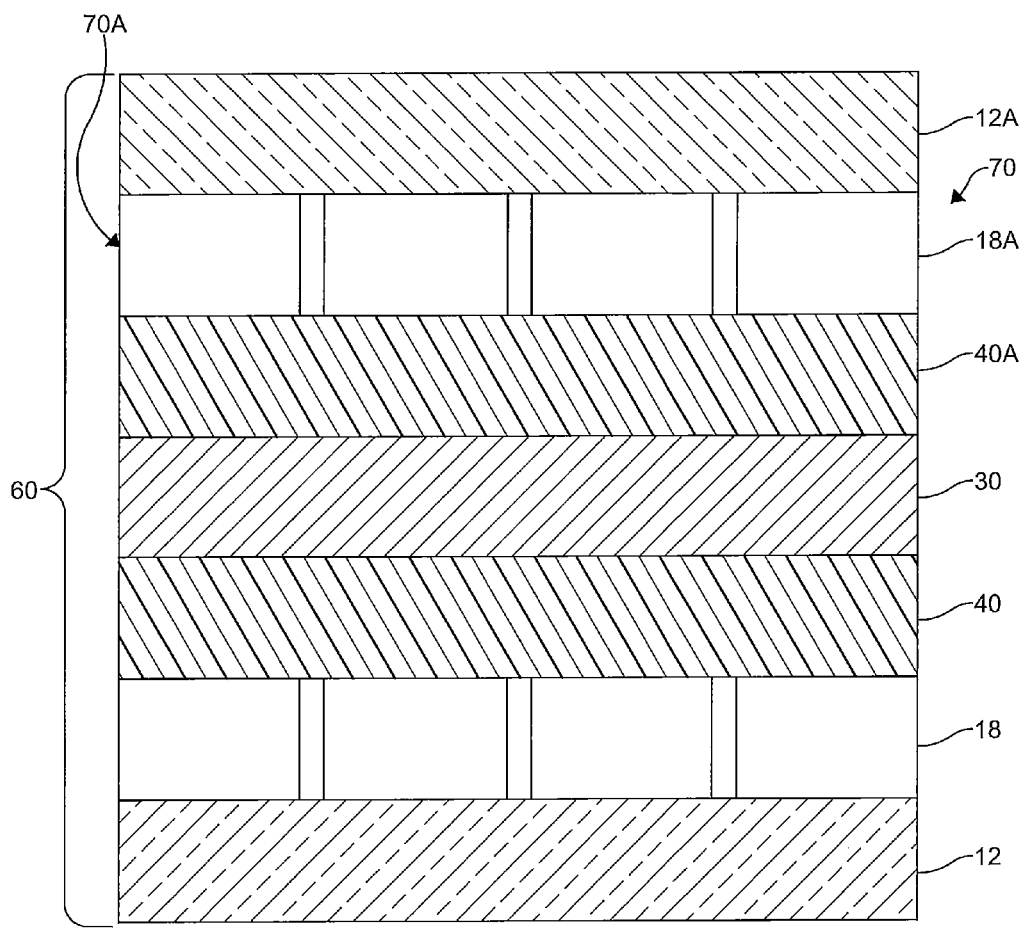
FIG. 4 is a cross-sectional view of another embodiment of a particle detector in accordance with the invention.

In the embodiment illustrated in FIG. 4, the particle detector 60 comprises the first diffusion barrier 40 and a second diffusion barrier 40A. The second diffusion barrier 40A may be disposed over and on the neutron activation layer 30. In this embodiment, a second back electrode layer (not depicted) is disposed over the second diffusion barrier 40A. A second semiconductor junction 18A having at least an n-type layer and at least a p-type layer is disposed over the second back electrode layer. A second front electrode layer (not depicted) is disposed over the second semiconductor junction 18A and a second support member 12A is disposed over the second front electrode layer.

In an embodiment, the diffusion barrier 40, 40A comprises SiO2, SnO2, TiO2, Al2O3, TiN, TaN, or another like non-conductive material. In another embodiment, the diffusion barrier 40, 40A may comprise a photoresist material, UV adhesive, or another organic substance. In this embodiment, the diffusion barrier 40, 40A may be thinned down by spin coating or another method. In yet other embodiments (not depicted), the diffusion barrier may be a space provided between the neutron activation layer 30 and the back electrode layer 24, 24A. In this embodiment, the space may be filled with a gas or a gas mixture or, alternatively, the space may be evacuated. The gas may be of the inert variety such as, for example, nitrogen, helium, argon or mixtures thereof.

In certain embodiments, the neutron activation layer 30 comprises one or more sheets of neutron activation material separately prepared. In these embodiments, the diffusion barrier 40, 40A can be applied to the neutron activation layer 30 during formation of the layer 30. In these embodiments, the diffusion barrier 40, 40A may be a thin polymer layer or a mesh made of an insulating material. In one such embodiment, the diffusion barrier 40, 40A is a polymer sheet. In an embodiment, the polymer sheet comprises Kapton® manufactured by E. I. Du Pont de Nemours and Co., Teflon® manufactured by the E. I. Du Pont de Nemours and Co., Etnom® manufactured by Chemplex Industries, Inc., or is an insulating polymer mesh. When a polymer sheet is utilized, it is preferred that it is of a thickness which allows charged particles such as, for example, tritons to pass through it with only a slight loss of energy.

In other embodiments, the diffusion barrier 40, 40A is metallic. Preferably, when the diffusion barrier 40, 40A is metallic, the diffusion barrier is formed from a layer of metal that is of a thickness of 3 to 5 microns. The use of such a thin metallic layer as the diffusion barrier 40, 40A facilitates forming the particle detector 50, 60, 200 when two or more semiconductor junctions 18 are provided. A preferred metal for these embodiments is molybdenum.

Figure 5:
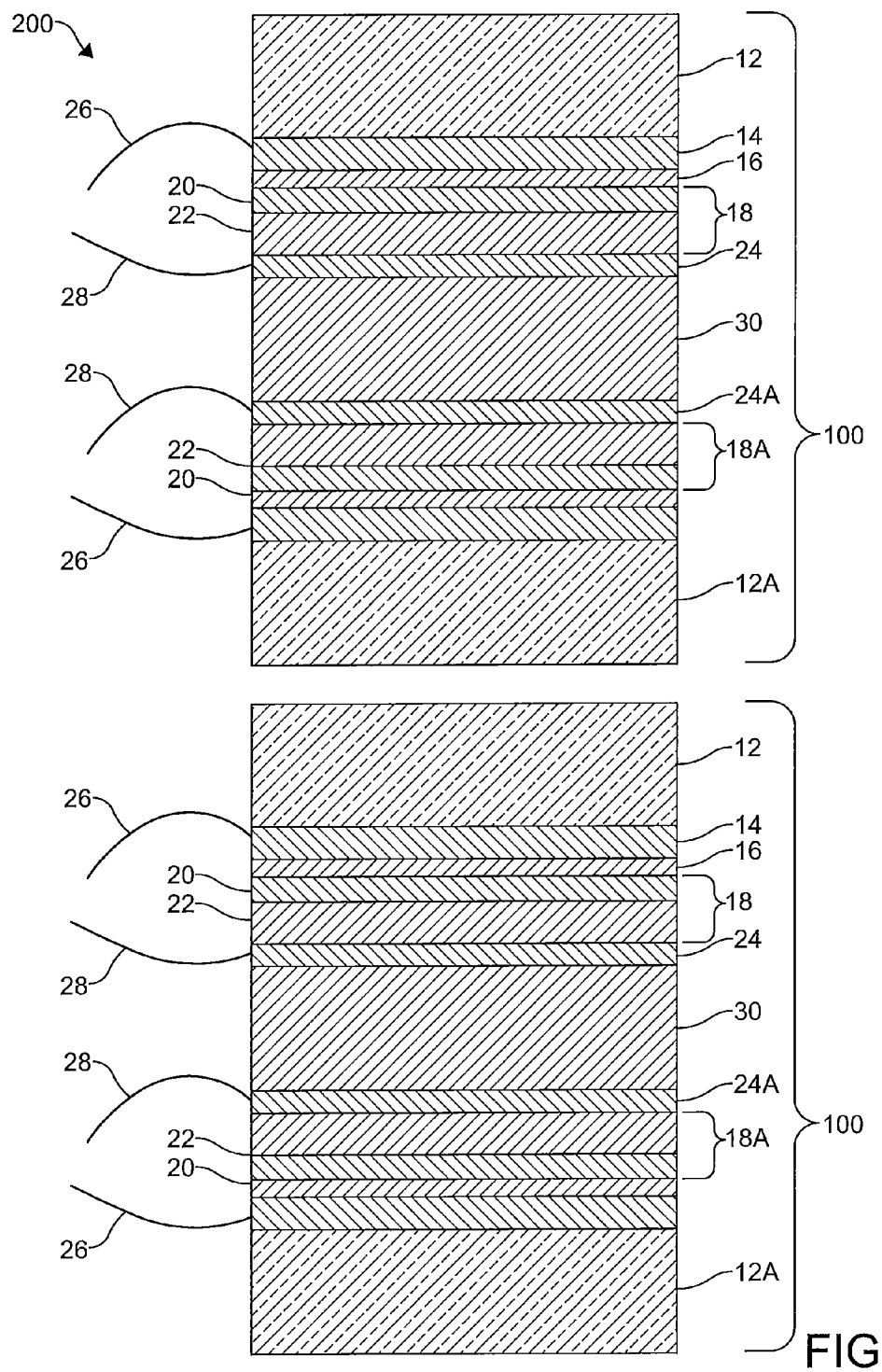
FIG. 5 is a cross-sectional view of another embodiment of a particle detector in accordance with the invention.

In certain embodiments like the one illustrated in FIG. 5, the particle detector 200 comprises two or more neutron activation layers 30. In this embodiment, the neutron activation layer(s) 30 may be affixed directly to one or more back electrode layers 24, 24A. Preferably, the total thickness of the neutron activation layer(s) 30 in the particle detector 10, 50, 60, 100, 200, 300, 400 is about 10 microns to about 500 microns. More preferably, the total thickness of the neutron activation layer(s) 30 in the particle detector 10, 50, 60, 100, 200, 300, 400 is 100-300 microns.

Preferably, each neutron activation layer 30 comprises a material which is an isotope with a high reaction cross-section for neutrons. In one such embodiment, the layer of neutron activation material consists of an isotope with a high reaction cross-section for thermal neutrons. Preferably, in these and other embodiments, the neutron activation layer 30 comprises lithium-6 (Li-6), boron-10 (B-10), cadmium-113 (Cd-113), or another isotope with a high thermal neutron cross-section. Also, it is preferred that the lithium, boron, and cadmium are isotopically enriched, respectively, in the isotopes Li-6, B-10, Cd-113 when utilized in a neutron activation layer 30. The lithium, boron, or cadmium may be in elemental form but also may be in the form of compounds such as LiF, BN, CdO, and similar. However, it is advantageous to use elemental forms to avoid unnecessary energy loss in the activation layer of the charged reaction particles produced by the neutron capture.

When provided adjacent a source of neutrons, thermal neutrons emitted from the source of neutrons pass into the particle detector 10, 50, 60, 100, 200, 300, 400. In embodiments where Li-6 is utilized in one or more of the neutron activation layers 30, the thermal neutrons react with the neutron activation layer(s) 30 generating alpha particles (He-4 nuclei) and tritons (H-3 nuclei), according to the following:

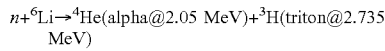

$$n + {}^6Li \rightarrow {}^4He(alpha@2.05\ MeV) + {}^3H(triton@2.735\ MeV)$$

As illustrated in FIG. 3, in order to be detected, the alpha particles and tritons must exit the neutron activation layer 30. Also, upon exiting the neutron activation layer 30, the particles must have enough energy to create ionization in a semiconductor junction 18 in order to be detected. The thickness of the neutron activation layer 30 can be selected to enable the particles to exit the neutron activation layer 30 and have enough energy to create ionization in a semiconductor junction 18. The thickness of the neutron activation layer 30 can also be selected to enable certain particles such as, for example, tritons to exit the neutron activation layer 30 and have enough energy to create ionization in a semiconductor junction 18 and reduce the number of other particles such as, for example, alpha particles from exiting the neutron activation layer 30 and being detected. In one such embodiment where the neutron activation layer 30 comprises Li-6, the thickness of the neutron activation layer 30 is selected to be 10 microns or more. In another such embodiment where the neutron activation layer 30 is Li-6, the thickness of the neutron activation layer is selected to be 100 microns or more. In this embodiment, most alpha particles will lose all their energy and fail to emerge from the Li-6 neutron activation layer, but most tritons will emerge and about half of them will emerge in the direction of the semiconductor junction.

Furthermore, the thickness of the neutron activation layer 30 can also be selected to increase the probability that particles will emerge from the neutron activation layer 30 and have enough energy to create ionization in a semiconductor junction 18. For example, the known cross-section for thermal neutron absorption in a Li-6 neutron activation layer is 940 barns. This yields a neutron absorption length in a pure Li-6 neutron activation layer of about 200 microns. If the Li-6 neutron activation layer is not isotopically enriched to 100%, the range will be greater since the Li-7 neutron cross-section is much smaller. To increase the number of neutrons detected, the thickness of the neutron activation layer 30 can be increased and two or more semiconductor junctions 18, 18A can be utilized in the particle detector 80, 200. In these embodiments, a neutron activation layer 30 is positioned between separate semiconductor junctions 18, 18A as is shown in FIGS. 4 and 5.

In the embodiments illustrated in FIGS. 4 and 5, the particle detector 60, 200 is oriented in the so called "back-to-back" geometry. However, the particle detector can be configured in other geometries. For example, in an embodiment like the one illustrated in FIG. 14, separate particle detectors can be provided in a "side-by-side" geometry. In still further embodiments, the particle detectors, whether oriented in the back-to-back geometry or the side-by-side geometry, can be positioned over each other to create an array of detectors as illustrated in FIG. 4. As will be discussed below, an array of detectors is useful in determining the direction of an incoming particle or neutron.

In the embodiment illustrated in FIG. 5, the particle detector 200 comprises two separate particle detectors 100. A description of each detector 100 can be found in U.S. patent publication no. 2015/0287872, the entire disclosure of which is hereby incorporated by reference. The detectors 100 illustrated in FIG. 5 are oriented in the back-to-back geometry such that a second support member 12A of the first detector abuts a first support member 12 of the second detector. Also, in this embodiment, the particle detector 200 comprises two neutron activation layers 30. It should also be noted that one or more high resistivity buffer layers 16, 16A may be included in the embodiments of the particle detector 200 illustrated in FIG. 5 as is depicted therein and/or as described above.

In order to increase the probability of detecting particles and/or enable nearly complete conversion of thermal neutrons into charged particles, particle detectors 10, 50, 60, 100, 200, 300, 400 can be combined and utilized in a particle detector assembly. The number of particle detectors 10, 50, 60, 100, 200, 300, 400 in such an assembly may be selected based on the total combined thickness of the neutron activation layers and/or by the desired neutron absorption, scattering, or detection efficiency. For example, in an embodiment, a particle detector may include one or more neutron activation layers comprising Li-6. In this embodiment, each neutron activation layer may be of a 40 micron thickness. On each side of the neutron activation layer, a semiconductor junction comprising a layer of 10 micron thick CdTe may be provided. The neutron detection efficiency for such a particle detector is 14.9%. The neutron transmission through such a particle detector is 76%. Thus, if a particle detector comprises four such detectors, the particle detector will have a neutron detection efficiency of 43.2%. Alternatively, if a particle detector comprises six such detectors, a neutron detection efficiency of 53.5% is provided for the particle detector. Other embodiments of the particle detector can reach similar efficiencies. For example, a particle detector comprised of six detectors, where each layer of CdTe has a thickness of 15 microns and each neutron activation layer comprises Li-6 at a thickness of 40 microns, can reach a neutron detection efficiency of 51%. Alternatively, a particle detector comprising five detectors, where each layer of CdTe has a thickness of 15 microns and each neutron activation layer comprises Li-6 at a thickness of 80 microns, can also reach a neutron detection efficiency of 51%.

In many applications, high neutron detection efficiency is less important than providing a particle detector that has a high overall sensitivity and can be manufactured at a low cost with low weight and low power consumption. As noted above, a particle detector comprising four detectors can be provided with a neutron detection efficiency of 43.2%. If the Li-6 neutron activation layer thickness for each of the four detectors is increased to 80 microns, the particle detector can be provided with a neutron detector efficiency of 46.3%. However, a neutron detector efficiency of 41.5% can be reached with only three detectors. In another embodiment, a neutron detector efficiency of 33.9% can be reached with two detectors if the Li-6 neutron activation layer thickness is increased to 90 microns. In general, neutron sensitivity is not strongly dependent on the uniformity of the neutron activation layer thickness and varies only about +/−1% per 10 microns of Li-6 for the two-, three-, and four-detectors.

Neutron detector efficiency can also be influenced by the composition of the semiconductor junction 18, 18A. In embodiments where the semiconductor junction 18, 18A comprises layers of CdS and CdTe, the cadmium portion of each layer may comprise an isotopic composition. Preferably, in this embodiment, one or both of the CdS and CdTe layers are depleted of Cd-113 isotope. The naturally occurring Cd-113 isotope, with an abundance of about 12% Cd-113, is characterized by a large thermal neutron absorption cross section but does not produce charged particle daughter products. Removing the Cd-113 isotope from the cadmium portion of the CdS layer and CdTe layer increases the neutron transmission of the semiconductor junction 18, 18A and increases the overall efficiency of the particle detector 10, 50, 60, 100, 200, 300, 400. More particularly, when the Cd-113 isotope is removed from a 10 micron CdTe layer, the neutron transmission through the layer increases from 96.4% to about 100%, which substantially increases the overall efficiency of the particle detector that the CdTe layer is utilized in.

Additionally, it should be noted that, because the Cd-113 isotope has a significant thermal neutron absorption cross-section, increasing the thickness of the CdTe semiconductor layer will result in some attenuation of the thermal neutron flux. However, increasing the thickness of the CdTe layer from 10 microns to 20 microns will reduce the efficiency only by about 2%, 3%, and 4% respectively, for two, three, and four detector configurations.

The particle detector 10, 50, 60, 100, 200, 300, 400 is formed with a shunt resistance. As used herein, shunt resistance ($R_{shunt}$) refers to the current leakage when a reverse bias is applied across the electrodes 14, 14A, 24, 24A of the particle detector. Preferably, the particle detector has a high shunt resistance so that the current leakage is low. In certain embodiments, the front electrode layer 14, 14A, semiconductor junction 18, 18A, and back electrode layer 24, 24A can be fabricated to have shunt resistance that leads to low leakage current when a reverse bias of up to 20 volts is applied across the front electrode layer 14, 14A and the back electrode layer 24, 24A. In these embodiments, the particle detector has a $R_{shunt}$ of 0.1 MegOhm or more. However, it is preferred that the $R_{shunt}$ of the detector is 10 MOhm or more. More preferably, the $R_{shunt}$ of the detector is 20 MOhm or more. Even more preferably, the $R_{shunt}$ of the detector is 50 MOhm or more.

The shunt resistance of the particle detector 10, 50, 60, 100, 200, 300 can be increased by providing a high resistivity buffer layer 16, 16A between the front electrode layer and the semiconductor junction and/or between the back electrode layer and the semiconductor junction, properly selecting the CdS and CdTe deposition methods and conditions for the deposition, and properly selecting the duration and temperature profile of the $CdCl_2$ treatment. Additionally, to achieve the desired shunt resistance, the particle detector 10, 50, 60, 100, 200, 300 can be subjected to additional processing steps prior to forming the front electrode layer 14, 14A or the back electrode layer 24, 24A. More particularly, the particle detector 10, 50, 60, 100, 200, 300 can be subjected to a negative photoresist (NPR) treatment, electrochemical treatment, selective laser ablation or another shunt passivation technique to achieve the desired shunt resistance. Examples of an NPR treatment, electrochemical treatment, and a selective laser ablation will be described with reference to the particle detector illustrated in FIG. 1. It should be appreciated that these shunt passivation techniques can be performed in a similar manner for the other embodiments of the particle detector described herein and illustrated in the figures.

In certain embodiments, shunts may be present in the particle detector 10 due to the formation of pinholes, or voids, in certain portions of the particle detector structure. A preferred technique for passivating shunts caused by pinholes in the particle detector 10 is negative photoresist (NPR) treatment. An NPR treatment is preferred when the support member 12 and front electrode layer 14 are transparent to the wavelengths of UV light (approximately 300 nm to approximately 400 nm).

In embodiments where an NPR treatment is utilized, a thin layer (0.1 micron to 10 micron) of NPR material is applied over the semiconductor junction 18, prior to forming the back electrode layer 24. In an embodiment, the NPR material is water soluble. An example of a suitable water soluble NPR material is "Instacolor" manufactured by Horizons Inc. After being applied to the semiconductor junction 18, the NPR material fills pinholes present in the CdTe layer.

Next, the NPR material is allowed to dry. After the NPR material is dried, the detector structure is exposed, preferably, from the front electrode layer side of the detector, to UV light for a period of time of about 1 second to about 300 seconds. The UV light penetrates through the pinhole so that the NPR material can receive the UV light. If a pinhole is present, the NPR material receiving the UV light and filling the pinhole is photopolymerized. When the NPR material polymerizes an electrically insulating body is formed in or above the pinhole. Preferably, the NPR material is then treated with a 0.1% to 3% hydrogen peroxide solution and the detector structure is rinsed in deionized water and dried. These steps remove NPR material that has not polymerized.

In other embodiments, shunts caused by pinholes can be passivated by a selective laser ablation technique. Utilizing such a technique removes one or more portions of one or more of the front electrode layer 14, high resistivity buffer layer(s) 16, 16A, semiconductor junction 18, and back electrode layer 24 at or near the pinhole. In still other embodiments, shunt passivation can occur by forcing a high reverse current through a pinhole. Forcing a high reverse current through the pinhole can be utilized to remove one or more portions of one or more of the front electrode layer 14, high resistivity buffer layer(s) 16, 16A, semiconductor junction 18, and back electrode layer 24 via vaporization at or near the pinhole or can be utilized in a chemically-assisted passivation technique. It should be appreciated that alternative passivation techniques are also suitable for use in forming the particle detector to have a high shunt resistance.

Referring now to FIGS. 1 and 3-5, the thickness preferred for the semiconductor junction 18, 18A is determined by the energy absorption rate of the charged particle in the semiconductor. Preferably, the thickness of the semiconductor junction 18, 18A is selected so that the particles deposit substantially all of their energy in the creation of electron-hole pairs in the semiconductor junction. In an embodiment, the thickness of a CdS/CdTe semiconductor junction is 2 microns or more. More preferably, the thickness of a CdS/CdTe semiconductor junction is 6 microns or more. In an embodiment, the thickness of a CdS/CdTe semiconductor junction is 6-35 microns. More preferably, the thickness of a CdS/CdTe semiconductor junction is 6-25 microns. When the CdS/CdTe semiconductor junction of the detector has a thickness of about 6 to 25 microns, it is preferred that the passivation of surfaces and grain boundaries via $CdCl_2$ treatment is performed in such a manner that recombination loss of the electrons and holes that are generated by energetic charged particles is minimized. Also, as noted above, for certain embodiments, post-deposition processing of the particle detector can be used to produce high shunt resistance by choosing the duration and temperature profile of the $CdCl_2$ treatment. In another embodiment, shunt passivation of surfaces and grain boundaries may be performed with HCl or $MgCl_2$ treatments.

When the particle detector 10, 50, 60, 100, 200, 300, 400 includes one or more layers of polycrystalline materials, grain boundaries between the layers often provide shunt paths. For these embodiments, it is advantageous to form the layers in a way that limits shunting along the grain boundaries and grain boundary recombination. In one such embodiment, shunt passivation along grain boundaries may be achieved using one or more CdCl2 treatments followed by utilizing one or more additional shunt passivation techniques described above. Typically, the CdCl2 treatment(s) and one or more additional shunt passivation techniques are performed prior to the formation of the back electrode layer 24, 24A. For example, the one or more additional shunt passivation techniques may utilize a water soluble NPR material that can be photopolymerized after it is applied to the surface of a CdTe layer. Preferably, in this embodiment, the water soluble NPR material is "Instacolor" as described above or a similar material. Desired particle detector performance is obtained when the shunt resistance of the finished detector is 50 MOhm or more. More preferably, the shunt resistance is 100 MOhm or more. However, as noted above, in certain embodiments, the particle detector may exhibit a shunt resistance as low as 0.1 MOhm.

In many applications, it is desired to only record the event of a particle having entered or passed through the of the particle detector 10, 50, 60, 100, 200, 300, 400. In one such embodiment, the thickness of the CdTe layer is 25 microns or more and may capture all of the energy of the charged particle. In another embodiment, the thickness of the CdTe layer is less than 25 microns and captures much of the charged particle energy. However, in certain applications, it may be desired to identify the type of particle and the characteristics of the particles that have entered or pass through the particle detector 10, 50, 60, 100, 200, 300, 400. When it is desired to identify the type and/or characteristics of a particle, the particle detector 10, 50, 60, 100, 200, 300, 400 can identify the types of particles and some characteristics of the particles by the energy loss rate of the particles that have entered or passed through the semiconductor junction. The energy loss rate of a particle is determined by the charge and energy of the particle. The charge and energy of a particle can be determined by the particle detector desired to identify the type of particle and the characteristics by appropriate selection of the thickness of the layers of the semiconductor junction 18, 18A. To determine the loss rate, it is desirable that a particle lose only a small fraction of its total kinetic energy while passing through the semiconductor junction. Preferably, in embodiments where the semiconductor junction comprises polycrystalline layers of CdS and CdTe, the thickness of the CdS and CdTe layers are selected to be very thin so that the energy of the particle(s) is nearly constant as it passes through the heterojunction. For measuring energy loss rate and particle charge, preferably, the thickness of the CdTe layer is 350 nanometers (nm) or less. More preferably, the thickness of the CdTe layer is 250 to 350 nm.

Utilizing the particle detector 10, 50, 60, 100, 200, 300, 400 it may be desired to record the full energy of the charged particle, including without limitation alpha particles or tritons. In these embodiments, the thickness of the CdTe layer must be great enough to stop the charged particle in the CdTe layer. Ranges of these particles are well-known. For example, the range of a 2.7 MeV triton in CdTe is 35 microns and the range of a 5.5 MeV alpha particle in CdTe is 22 microns. Recording the full energy of such particles incident normal to the plane of the thin film, would require that the CdTe layer have a thickness of 35 microns to record the full energy of the tritons or a thickness of 22 microns to record the full energy of the alpha particles.

In other embodiments, it may not be required to record the particle's full energy or the energy loss rate. In such embodiments, where the semiconductor junction comprises layers of CdS and CdTe, the thickness of the CdTe layer may be chosen to yield a high signal-to-noise ratio that is consistent with recording the event of a particle having entered or passed through the of the particle detector 10, 50, 60, 100, 200, 300, 400. Increasing the thickness of the CdTe layer yields more generated electrons and holes and higher charge collection, Q, at the electrodes. Also increasing the thickness of the CdTe layer decreases the capacitance, C, of the particle detector 10, 50, 60, 100, 200, 300, 400. Both effects lead to higher voltage pulses according the relationship $V=Q/C$.

Figure 6:
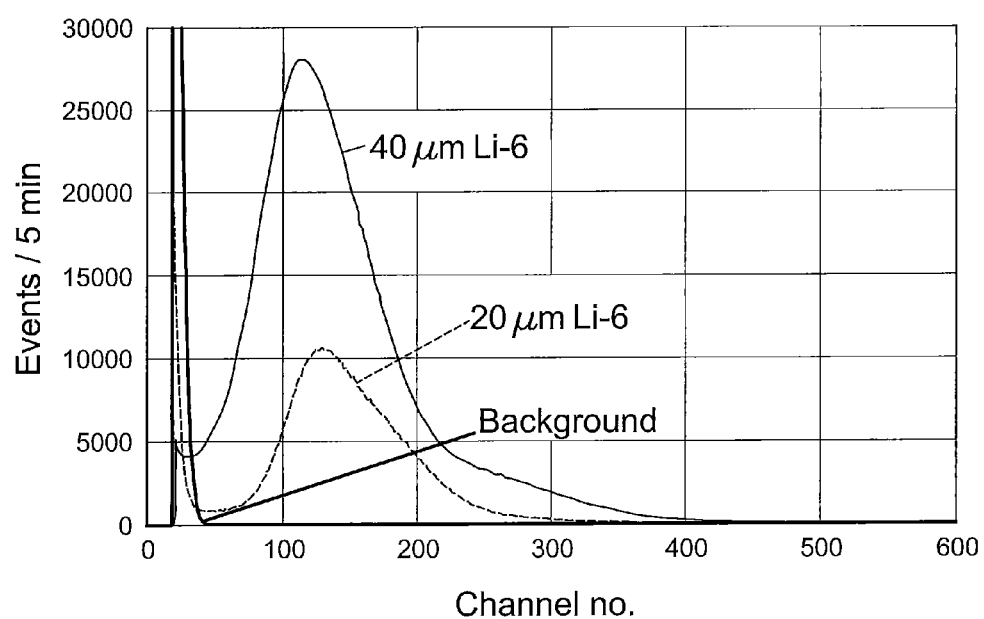
FIG. 6 is a histogram depicting the pulse-height distributions caused by thermal neutrons incident on an embodiment of the particle detector of FIG. 1 with a 14 micron thick CdTe layer and a size of 5 cm$^2$.
Figure 7:
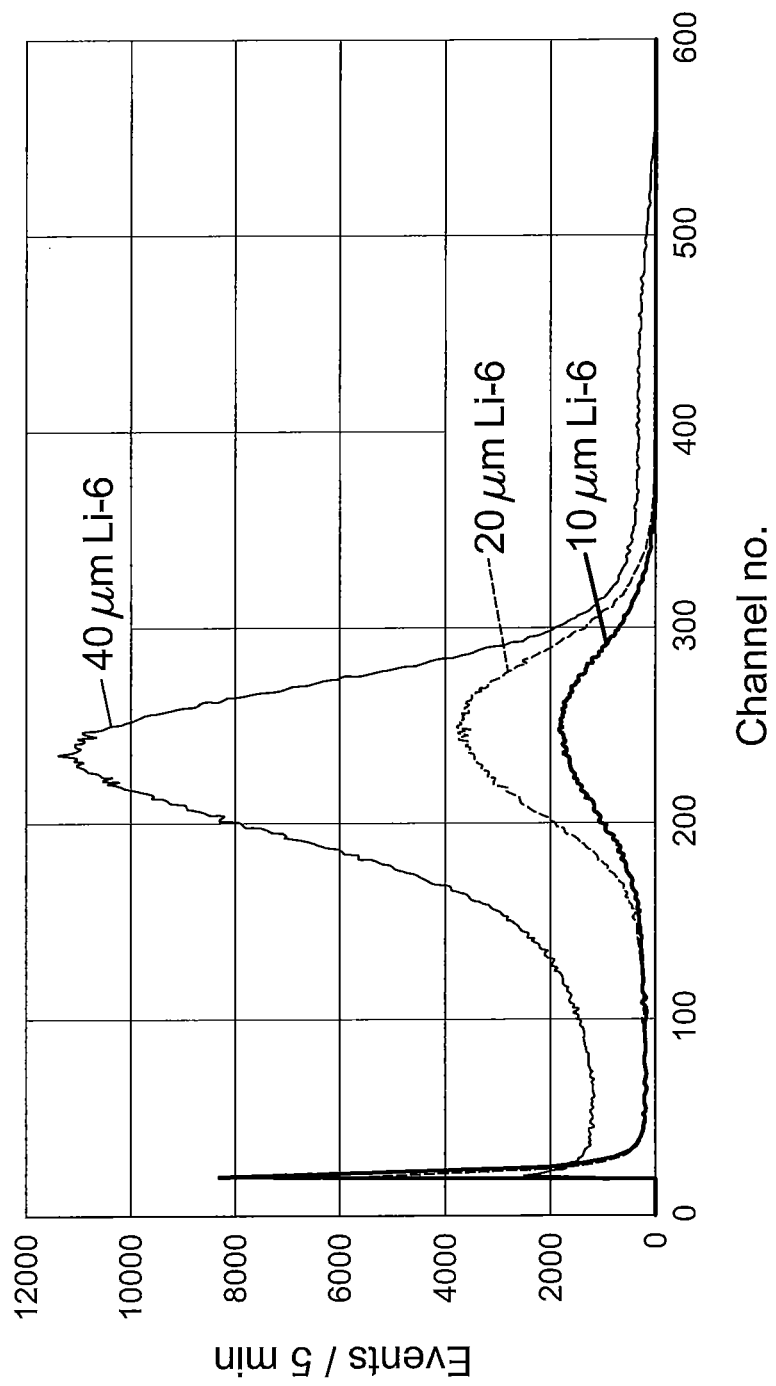
FIG. 7 is a histogram depicting the pulse-height distributions caused by thermal neutrons incident on an embodiment of the particle detector of FIG. 1 with a 21 micron thick CdTe layer and a size of 5 cm$^2$.

The effect of increasing the CdTe layer thickness from 14 microns to 21 microns can be seen in FIGS. 6 and 7. In FIG. 6, the detection of tritons and alphas produced by thermal neutrons reacting with Li-6 neutron activation layers having thicknesses of 20 microns and 40 microns is illustrated. FIG. 6 also illustrates an embodiment of the particle detector that does not have a neutron activation layer, which is labelled as background. In FIG. 7, the detection of tritons and alphas produced by thermal neutrons reacting with Li-6 neutron activation layers having thicknesses of 10 microns, 20 microns, and 40 microns is illustrated. In FIGS. 6 and 7, each embodiment of the particle detector was 5 $cm^2$ and the channel no. is proportional to the voltage pulse produced by a triton or alpha particle when it is detected. The higher voltage pulses shown in FIG. 7, for the particle detector having the CdTe layer of the 21 micron thickness, result from the lower capacitance and more charge generation.

For detecting 2.7 MeV tritons that are produced by a Li-6 neutron activation layer, it is preferable to detect the tritons using one or more polycrystalline CdTe layers. It is preferable that each polycrystalline layer used have a thickness in the range of about 2 microns to about 35 microns. In an embodiment, each polycrystalline CdTe layer used has a thickness from 8 microns to 35 microns. More preferably, for certain applications, the thickness of each polycrystalline CdTe layer is from about 12 microns to 25 microns.

Utilizing a thin polycrystalline CdTe layer is advantageous because it allows gamma radiation to pass through the semiconductor junction 18, 18A without being detected. For example, utilizing a CdTe layer having a thickness of 2 microns will provide a Compton scattering probability of only $7.0 \times 10^{-5}$ for a gamma ray of about 1 MeV. Such low scattering ensures that background gamma radiation detection is minimal. Furthermore, after Compton scattering, the signal produced in the particle detector 10, 50, 60, 100, 200, 300, 400 will depend on how much energy is deposited by the Compton electron in the CdTe layer before it exits. For example, a 0.1-3 MeV electron has a stopping power of less than 2 MeV-cm$^2$/g and for the density of CdTe (5.8 g/cm$^2$) this equals an attenuation coefficient of µ=11.6 MeV/cm. Thus, in a layer of CdTe having a thickness of 2 microns, the energy deposited by a Compton scattered electron generated by a gamma ray will be only 2.3 keV, which will create about 460 electron-hole pairs. Utilizing a signal filter, a threshold can be selected to reject Compton scattered electrons generated by gamma radiation. After selecting the desired threshold to reject Compton scattered electrons generated by gamma radiation, only Compton electrons scattered moving in a direction parallel to the CdTe layer will create an electron-hole pair and a pulse large enough to be displayed. It should be appreciated that this will be a rare event.

Figure 8:
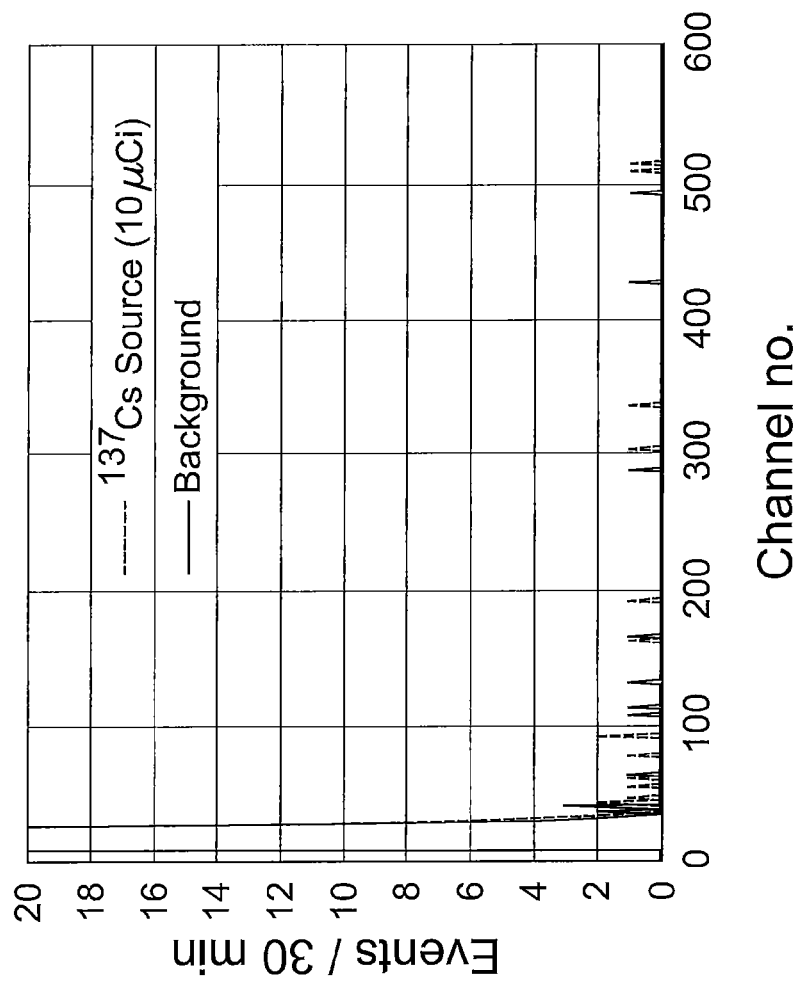
FIG. 8 is a histogram depicting the pulse-height distributions caused by gamma rays incident on an embodiment of the particle detector.

A histogram illustrating the gamma sensitivity of an embodiment of the particle detector, having a 23 micron thick CdTe layer, is shown in FIG. 8. In this embodiment, the particle detector did not have a neutron activation layer and was of a 6 cm$^2$ area. To illustrate gamma sensitivity for the particle detector, a Cs-137 source with an activity of 10 micro-Curies and a source of a 6V bias was used. Referring to FIG. 8, the histogram of pulse heights shows only 11 pulses in channels above channel 50 which corresponds to an energy deposition of about 200 keV from electrons Compton-scattered by the 0.662 MeV gammas emitted from the Cs-137 source. Thus, less than about one in one million gammas that are incident on the detector produce a detectable event. As another example (not depicted), a 4 cm$^2$ particle detector having a CdTe layer of a 23 micron thickness was utilized to detect particles emitted from a Cs-137 source with an activity of 10 micro-Curies. In this embodiment, the particle detector has a gamma detection fraction of less than 3×10$^{-8}$. This demonstrates the advantages of the particle detector to detect neutrons in the presence of very high background fluxes of gammas.

It is preferable that certain portions of the particle detector 10, 50, 60 100, 200, 300, 400 such as, for example, the semiconductor junction(s) 18, 18A and neutron activation layer(s) 30 described above are protected from environmental degradation. Thus, in certain embodiments, the particle detector 10, 50, 60 100, 200, 300, 400 may comprise a sealed enclosure which prevents the ingress of moisture, oxygen, and other environmental vapors and gases. Examples of enclosures suitable for use with the embodiments of the particle detector 10, 50, 60 100, 200, 300, 400 described herein are described and illustrated in U.S. patent publication no. 2015/0287872.

Figure 11:
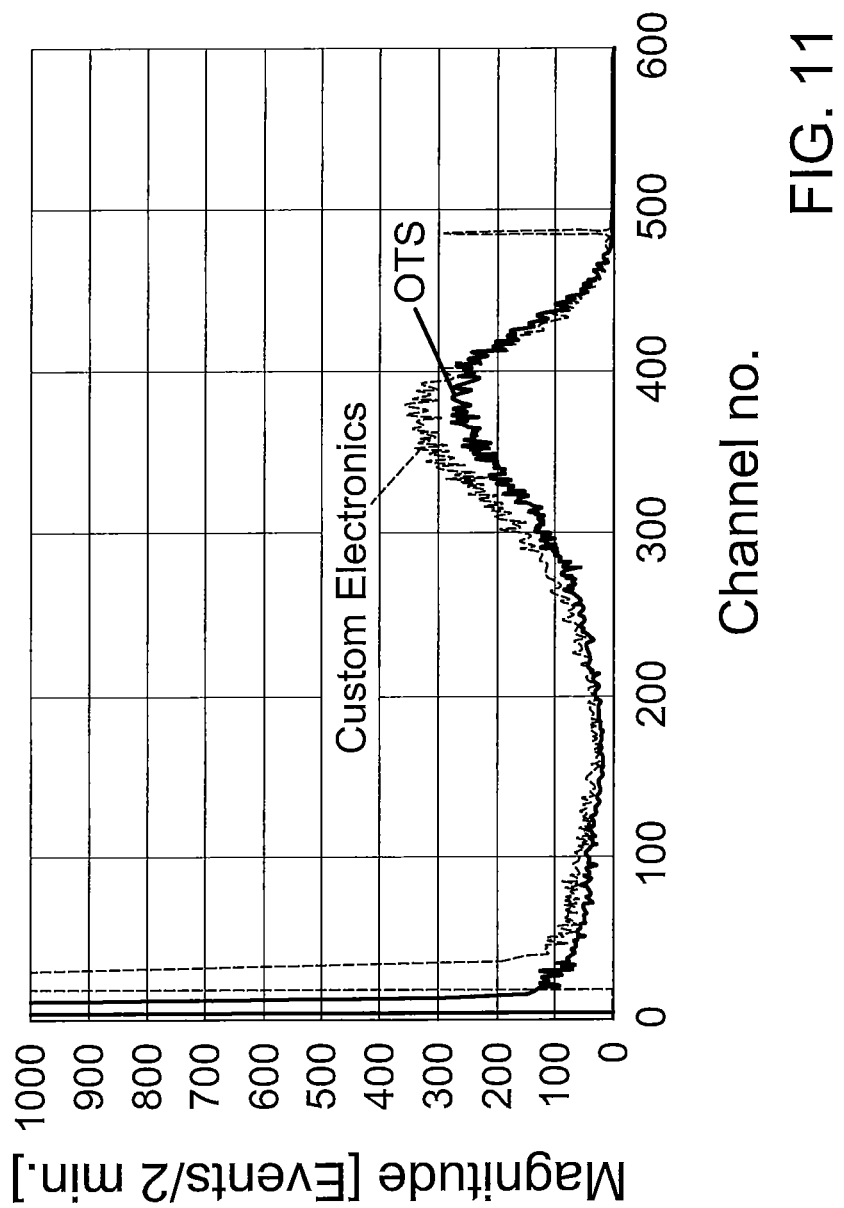
FIG. 11 is a histogram of pulse heights caused by alpha particles incident on the particle detector embodiment of FIG. 1 (without a neutron activation layer) and amplified either with commercial off-the-shelf (OTS) electronics or low-cost, custom-designed electronics in accordance with the invention.

When charged particles stop in or pass through the particle detector 10, 50, 60, 100, 200, 300, 400 ionization occurs. When ionization occurs, electron-hole pairs are formed in the semiconductor junction 18, 18A. An energetic charged particle may create 100,000 or more electron-hole pairs in the semiconductor. The electrons and holes of the electron-hole pairs are separated by the electric field provided by the semiconductor junction 18, 18A and the signal is produced by the particle detector 10, 50, 60, 100, 200, 300, 400 which indicates that particles have stopped in or have passed through the semiconductor junction 18, 18A. The signal can be of the pulsed variety. Also, it should be noted that each semiconductor junction 18, 18A may comprise an electric field that separates the electron-hole pairs and their respective electron and hole. The electrons and the holes of the electron-hole pairs are collected at the front electrode layer(s) 14, 14A and the back electrode layer(s) 24, 24A respectively, to provide the signal. As illustrated in FIG. 11, where the particle detector was used in combination with a pulse height analyzer (PHA), the histogram of pulse heights illustrates a comparison between certain embodiments of the particle detector described herein using an off-the-shelf (OTS) preamplifier and shaping amplifier and custom electronics designed particularly for the particle detector embodiments. In the embodiments of the particle detector illustrated in FIG. 11, 5.5 MeV alpha particles were provided from an Am-241 source. To deliver the alpha particles, the Am-241 source was placed at a distance of 13 mm from the particle detector. The particle detector was 0.35 cm$^2$ in size and included a CdTe layer of 10 microns in thickness. The preamplifier was of the charge sensitive variety.

As noted above, the particle detector 10, 50, 60, 100, 200, 300, 400 can be formed from materials that can be utilized with low cost manufacturing methods. In an embodiment, one or more of the front electrode layer 14, 14A, high resistivity buffer layer 16, 16A, semiconductor junction 18, 18A and back electrode layer 24, 24A are formed utilizing magnetron sputtering deposition. However, other deposition methods such as sublimation, evaporation, vapor transport deposition, chemical bath deposition and chemical vapor deposition are suitable methods for use in forming one or more of those layers. Also, the support member 12, 12A can be provided as a ribbon or web and utilized in a roll-to-roll manufacturing process during formation the aforementioned portions of the particle detector.

The thickness and lateral size of the particle detector 10, 50, 60, 100, 200, 300, 400 can be selected to provide a balance between particle conversion, electron-hole pair generation, collection efficiency and/or detector capacitance. The signal can be utilized to select and maximize the lateral size of the particle detector 10, 50, 60, 100, 200, 300, 400 and improve the signal-to-noise ratio.

The size or area of the particle detector 10, 50, 60, 100, 200, 300, 400 can be defined by removing portions of certain layers of the particle detector. Preferably, the removed portions are removed via a scribing process or chemical etching process. Examples of scribing processes suitable for use in forming the particle detector 10, 50, 60, 100, 200, 300, 400 include laser scribing or mechanical scribing. In certain embodiments, the laser scribing process may include the use of a laser capable of providing a finely focused laser beam. The mechanical scribing process is preferably performed using a stylus. When a scribing process is utilized, a pattern of removed portions can be formed, via vaporization, mechanically, or another mechanism, through layers of the particle detector 10, 50, 60, 100, 200, 300, 400. The removed portions provide electrical isolation between portions of particle detector.

By removing portions of certain layers, the embodiments of the particle detector 10, 50, 60, 100, 200, 300, 400 described above can be divided into one or more detectors capable of detecting particles. In an embodiment, like the one illustrated in FIG. 12, the particle detector 300 can comprise a single detector 70 which is defined by removing portions of certain layers of the particle detector. In other embodiments, like the ones illustrated in FIGS. 4 and 14, the particle detector 60, 400 can be divided into two or more detectors 70, 70A. In these embodiments, the particle detector can comprise one or more detectors 70, 70A by removing portions of the detector via a laser scribing process or mechanical scribing process as described above. Dividing the particle detector allows the particle detector to comprise one or more detectors 70, 70A which may have a size of a square millimeter or several square meters.

Figure 12:
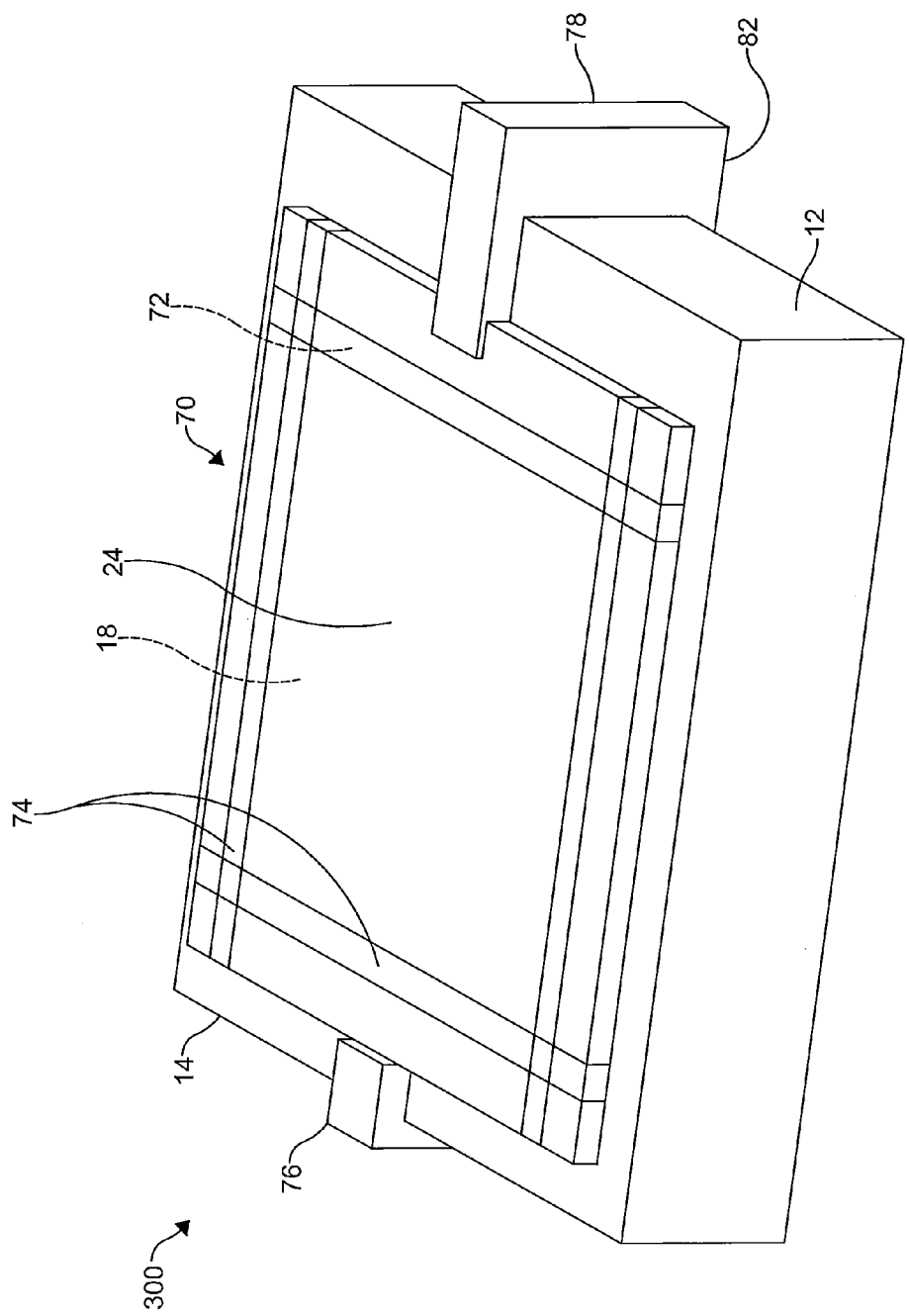
FIG. 12 is a perspective view of another embodiment of a particle detector in accordance with the invention.

In an embodiment, like the one illustrated in FIG. 12, the detector 70 comprises one or more of the layers described for the particle detector 10 illustrated in FIG. 1. It should be appreciated that the detector can also comprise layers described for the embodiments illustrated in FIGS. 3-5. Preferably, the detector 70 comprises a portion of the support member 12, a portion of the front electrode layer 14, a portion of the semiconductor junction 18, and a portion of the back electrode layer 24. It should be appreciated that, when the particle detector 70 is configured to detect neutrons, a neutron activation layer (not depicted) would be provided adjacent the back electrode layer 24. It should be appreciated that when a particle detector or particle detector assembly comprises two or more detectors 70, 70A, the detectors 70, 70A may be similarly configured.

In the embodiment illustrated in FIG. 12, the detector 70 is formed by removing portions of the front electrode layer 14, semiconductor junction 18, and a portion of any other layers provided between the front electrode layer and semiconductor junction such as, for example, one or more high resistivity buffer layers. After the portions of the front electrode layer 14 and semiconductor junction 18 are removed, the space created by removing the portions of the front electrode layer and semiconductor junction is filled with an insulating material 72. In certain embodiments, the body of insulating material 72 comprises an NPR material like the ones described above. Next, the back electrode layer 24 is formed. After forming the back electrode layer 24, one or more portions 74 of the back electrode layer 24 are removed.

Figure 13:
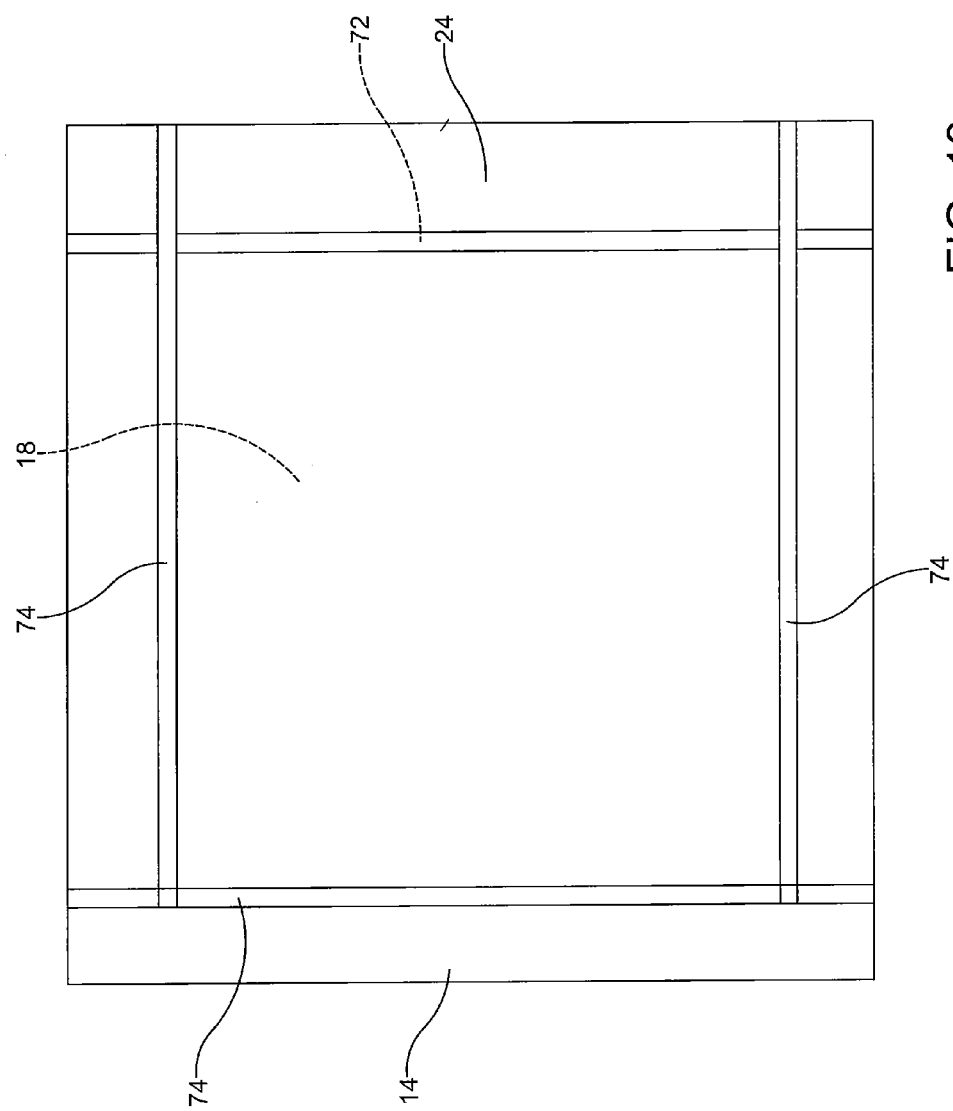
FIG. 13 is a top view of a portion of the particle detector of FIG. 12.

As illustrated best in FIG. 13, the body of insulating material 72 may be oriented in a perpendicular relationship with one or more of the removed portions 74 of the back electrode layer 24. Also, in an embodiment, the body of insulating material 72 may be oriented in a parallel relationship with a removed portion 74 of the back electrode layer 24. Removing the portions of the front electrode layer 14, semiconductor junction 18, and back electrode layer 24 allows the detector 70 to be electrically isolated from the surrounding portions of those layers.

Figure 14:
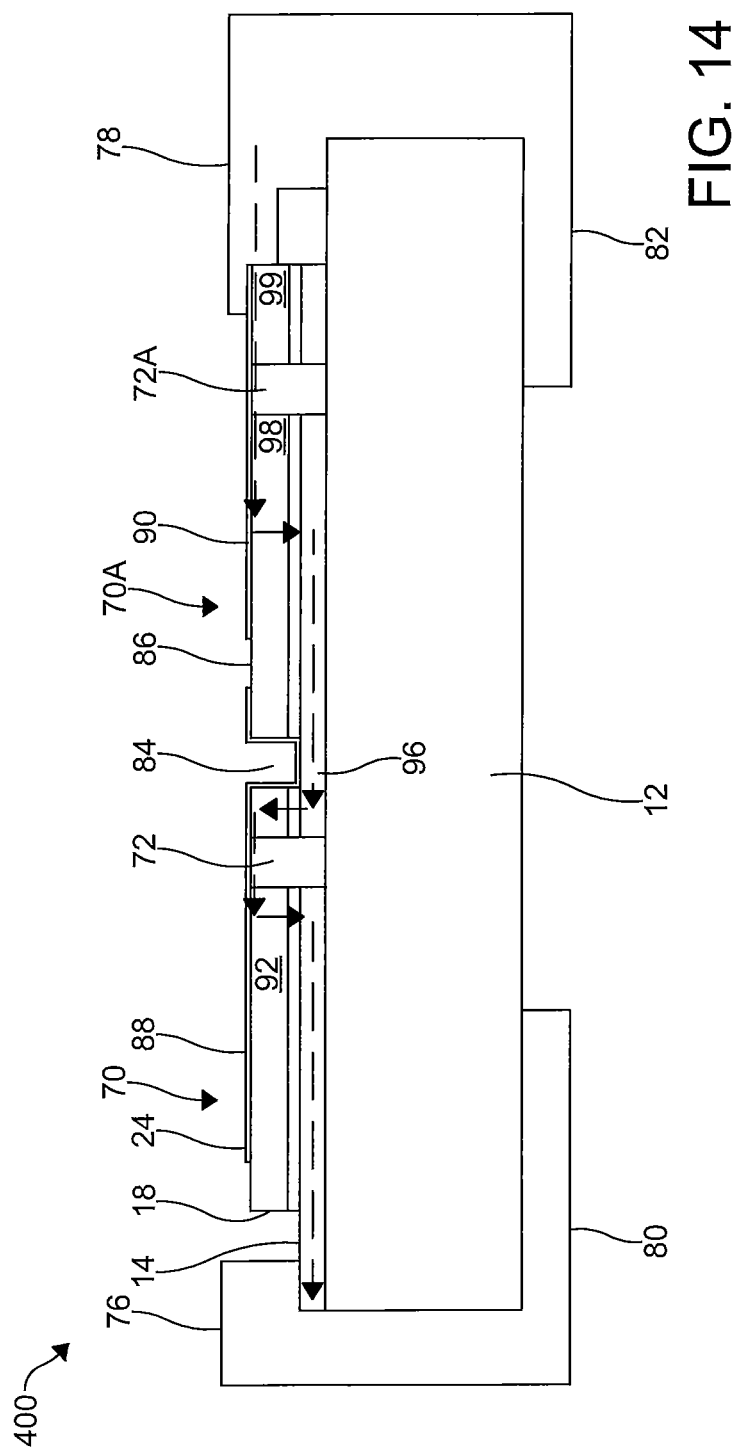
FIG. 14 is a cross-sectional view of another embodiment of a particle detector in accordance with the invention.

Referring back to FIG. 12, in order to send a signal from the detector, a first contact electrode is provided in electrical communication with an exposed portion of the front electrode layer 14 and a second contact electrode 78 is provided in electrical communication with a portion of the back electrode layer 24. Preferably, the first contact electrode 76 is a negative electrode and the second contact electrode 78 is a positive electrode. Also, it is preferred that the first contact electrode 76 comprises a first pad 80 and the second contact electrode 78 comprises a second pad 82 as is shown in FIG. 14. The pads 80, 82 are configured to facilitate electrical connection to and communication with electronic portions when the detector 70 is utilized in a particle detector assembly.

In an embodiment, a portion of the first contact electrode 76 is provided over a portion of the front electrode layer 14 and a portion of the second contact electrode 78 is provided over a portion of the back electrode layer 24. The first contact electrode 76 and the second contact electrode 78 may each be formed to also cover portions of the support member 12. In this embodiment, the first contact electrode 76 may cover portions of the support member 12 which are located on opposite sides thereof and the second contact electrode 78 may cover portions of the support member 12 which are located on opposite sides thereof.

Figure 16:
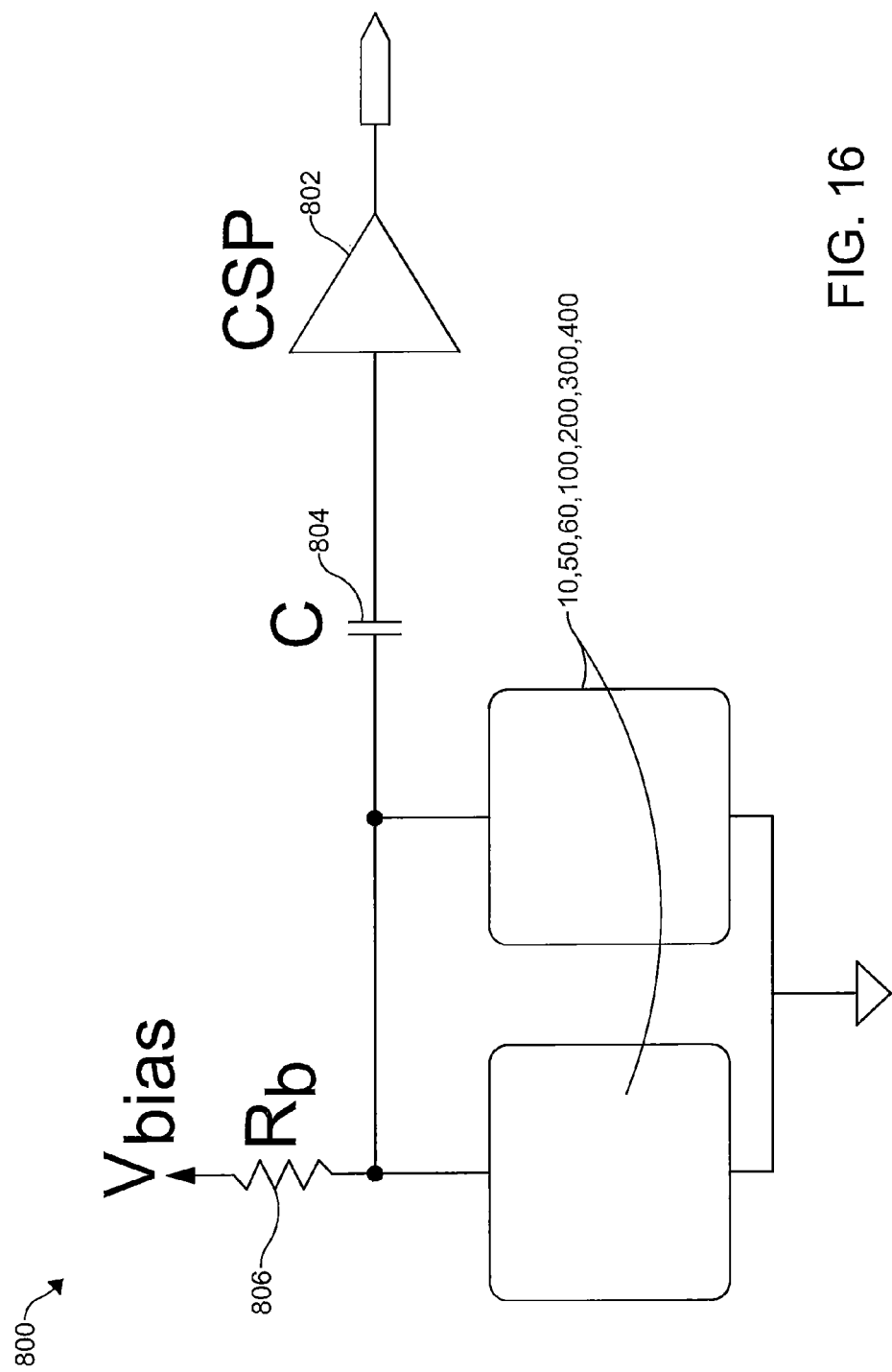
FIG. 16 is an electrical schematic diagram of another embodiment of a particle detector assembly in accordance with the invention.

In certain embodiments, the particle detector 400 may comprise two or more detectors 70, 70A which are in electrical communication. Also, in certain embodiments, a particle detector assembly 800 may comprise two or more detectors 70, 70A which are in electrical communication. As illustrated in FIG. 16, in one such embodiment, the two or more detectors 70, 70A may be electrically connected in parallel. In another embodiment, like the one illustrated in FIG. 14, the two or more detectors 70, 70A may be electrically connected in series. In this embodiment, it is preferred that the two or more detectors 70, 70A are formed on the same support member 12. Providing two or more detectors 70, 70A in a series connection reduces the overall capacitance of the particle detector.

Figure 15:
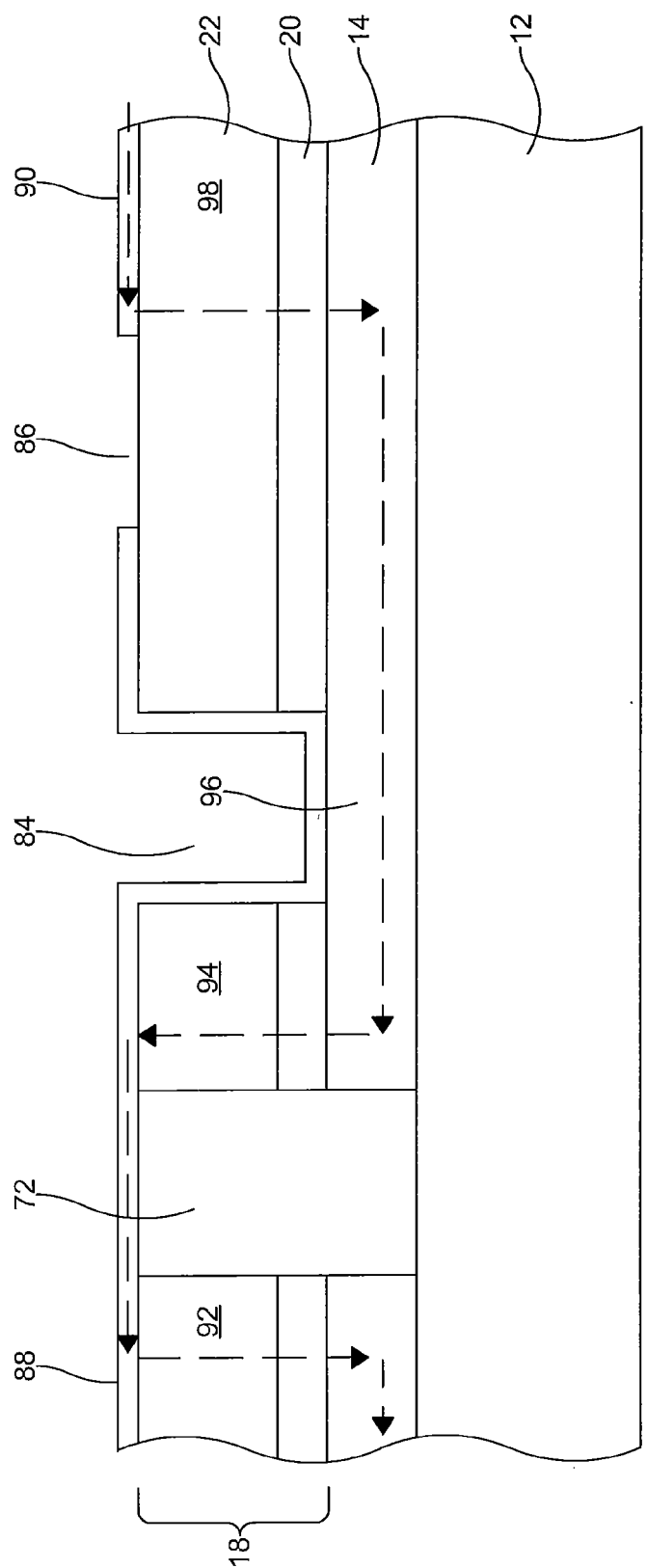
FIG. 15 is an enlarged view of a portion of the particle detector of FIG. 14.

Referring now to FIGS. 14-15, the first detector 70 is formed by removing first portions of the front electrode layer 14, semiconductor junction 18 and a first portion of any other layers provided between the front electrode layer 14 and semiconductor junction 18. After the first portions of the front electrode layer 14 and semiconductor junction 18 are removed, the space created by removing the first portions of the front electrode layer 14 and semiconductor junction 18 is filled with an insulating material 72.

A second portion of the semiconductor junction 18 and a second portion of any other layers provided between the front electrode layer 14 and semiconductor junction 18 are also removed. Removing the second portion of the semiconductor junction 18 forms a groove 84 in the semiconductor junction 18. The removed second portions are oriented in a parallel relationship with the removed first portions of the front electrode layer 14 and semiconductor junction 18.

The second detector 70A is formed by removing a second portion of the front electrode layer 14, a third portion of the semiconductor junction 18 and another portion of any other layers provided between the front electrode layer 14 and semiconductor junction 18. After these portions are removed, the space created is filled with an insulating material 72A. The insulating material 72A may be of the same variety utilized to form the first detector 70. Additionally, the body of insulating material 72A utilized to form the second detector may be oriented in a parallel relationship the body of insulating material 72 utilized to form the first detector 70.

Next, the back electrode layer 24 is formed over portions of the semiconductor junction 18, insulating material 72, 72A, and an exposed portion of the front electrode layer 14 provided by the removed second portions. After forming the back electrode layer 24, a portion of the back electrode layer 24 is removed. The removed portion 86 of the back electrode layer 24 is provided between the groove 84 and the body of insulating material 72A utilized to form the second detector. The removed portion 86 of the back electrode layer 24 may be oriented in a parallel relationship with the bodies of insulating material 72, 72A utilized to form the first detector 70 and the second detector 70A. The removed portion 86 of the back electrode layer 24 partially defines the back electrodes for the detectors 70, 70A and prevents the separated back electrode layers 88, 90 from directly communicating with each other.

As best illustrated in FIG. 15, the first detector back electrode layer 88 is provided over a first portion 92 of the semiconductor junction, the first body of insulating material 72, a third portion 94 of the semiconductor junction, and in the second removed portion so that the first detector back electrode layer 88 is disposed on a portion 96 of the front electrode layer. In this embodiment, the first portion 92 of the semiconductor junction and the third portion 94 of the semiconductor junction are separated by the first body of insulating material 72. Referring back to FIG. 14, the second detector back electrode layer 90 is provided over a second portion 98 of the semiconductor junction, the second body of insulating material 72A, and a fourth portion 99 of the semiconductor junction. Also, in this embodiment, the second portion 98 of the semiconductor junction and the fourth portion 99 of the semiconductor junction are separated by the second body of insulating material 72A.

In order to send a signal from the series connected detectors 70, 70A, the first contact electrode 76 is provided in electrical communication with an exposed portion of the front electrode layer 14 of the first detector 70. Further, the second contact electrode 78 is provided in electrical communication with a portion of the back electrode layer 90 of the second detector 70A. Preferably, the first contact electrode 76 is a negative electrode and the second contact electrode 78 is a positive electrode. Also, it is preferred that the first contact electrode 76 comprises the first pad 80 and the second contact electrode 78 comprises a second pad 82 as described above for the embodiments illustrated in FIGS. 12-13. The pads 80, 82 are configured to facilitate electrical connection to and communication with electronic portions when the detectors 70, 70A are utilized in a particle detector assembly. Further, in this embodiment, a portion of the first contact electrode 76 is provided over a portion of the front electrode layer of the first detector 70 and a portion of the second contact electrode 78 is provided over a portion of the back electrode layer of the second detector 70A. More particularly, the second contact electrode 78 is attached to the portion of the back electrode layer provided over the fourth portion 100 of the semiconductor junction. Further, the first contact electrode 76 and the second contact electrode 78 may each be formed to also cover portions of the support member 12 as described above.

The embodiments of the particle detector 10, 50, 60, 100, 200, 300, 400 can be utilized in a particle detector assembly 600, 700, 800, 900. The particle detector assembly 600, 700, 800, 900 may be non-imaging. Alternatively, the embodiments of the particle detector 10, 50, 60, 100, 200, 300, 400 can be utilized in a particle detector assembly 600, 700, 800, 900 that is configured as an array to provide spatial sensitivity and imaging. In embodiments where imaging and spatially sensitive is desired, one or more particle detectors 10, 50, 60, 100, 200, 300, 400 can be provided in an array and several layers of arrays can be assembled to allow data from the detectors 10, 50, 60, 100, 200, 300, 400 to be analyzed to determine the direction of the incoming particle or neutron. This feature can help to locate a source of particles such as, for example, special nuclear material. In addition, spatial sensitivity may enable the particle detector 10, 50, 60, 100, 200, 300, 400 to be utilized in a beam profiling instrument in a neutron reactor and in other high energy particle accelerator systems. In the imaging and non-imaging embodiments, the sensitivity of the particle detector 10, 50, 60, 100, 200, 300, 400 can be selected to detect charged particles over large areas to achieve a low detection threshold and to discriminate against gamma radiation.

Referring now to FIGS. 9-10 and 16-17, in certain embodiments, the particle detector assembly 600, 700, 800, 900 comprises one or more of the particle detectors 10, 50, 60, 100, 200, 300, 400 described above. Referring now to FIG. 9, the particle detector assembly 600 also comprises a preamplifier 36 and signal conditioner 38. The preamplifier 36 may be in direct electrical contact with the particle detector 10, 50, 60, 100, 200, 300, 400 and is preferably of the charge sensitive variety. The signal is fed into the input of the preamplifier 36. A microcontroller 42 receives the raw conditioned signal from the signal conditioner 38 and digitizes the signal. The microcontroller 42 also analyses the signal to algorithmically sort out false positives and spurious signal data. The signal conditioner 38 also comprises one or more signal filters to reject signals produced from absorption of gamma and other types of radiation from being displayed with the pulsed signal indicating the presence of alpha particles, tritons, neutrons and/or other particles of interest that are detected. The one or more signal filters may be a discriminator. The discriminator may be of the low level variety or of the upper level variety. In these embodiments, the discriminator can be set to reject the signal produced by the absorption of gamma or another type of radiation by Cd-113 in the CdTe layer. From the signal conditioner 38, the signal can be sent to another amplifier 44 to increase signal strength and/or be multiplexed. The signal may also be sent to a display 46 such as a user interface or readout electronics.

As illustrated in FIG. 10, in another embodiment, the particle detector assembly 700 comprises a single particle detector 10, 50, 60, 100, 200, 300, 400, an input to a preamplifier or field-effect transistor (FET) 702, the preamplifier 704, a filter 706, and a shaping amplifier 708. In this embodiment, the preamplifier 704 may be of the high gain charge-sensitive variety. The current pulse generated by energetic charged particles interacting with the detector is amplified by the pre-amplifier 704 in conjunction with the FET input 702. Preferably, in this embodiment, the pre-amplifier is of the high gain variety and the FET input 702 is discrete. The output of the pre-amplifier 704 is AC coupled through the filter 706 to the shaping amplifier 708 which conditions the signal for processing by the counting circuitry.

The field-effect transistor 702, high gain charge-sensitive preamplifier 704, filter 706, and shaping amplifier 708 are configured to match the characteristics of the detector 10, 50, 60, 100, 200, 300, 400 including its capacitance, leakage current, and the thickness of the CdTe layer.

In certain embodiments, the output signal from the two or more particle detectors 10, 50, 60, 100, 200, 300, 400 connected in series may be fed to the input of a preamplifier. Advantageously, in certain embodiments, the particle detector assembly is configured so that the two or more detectors 10, 50, 60, 100, 200, 300, 400 can feed signals to the preamplifier, preferably of the charge-sensitive variety, even when the detectors have different characteristics and are operated with a voltage bias.

Generally, the capacitance of a planar, solid-state detector scales in proportion to the cross-sectional area of the device. However, in the case of a particle detector, an increase in capacitance degrades the operational gain of the charge sensitive preamplifier (CSP). Detectors 70, 70A connected in series, such as those shown in FIG. 14, have a reduced effective capacitance and require a larger bias voltage to offset the voltage drop across each detector.

Thus, in an embodiment, like the one illustrated in FIG. 16, the particle detector assembly 800 comprises two or more particle detectors 10, 50, 60, 100, 200, 300, 400 connected in parallel. In this embodiment, the two or more particle detectors 10, 50, 60, 100, 200, 300, 400 are in electrical communication with a pre-amplifier 802 via an AC coupling capacitor 804. Preferably, the pre-amplifier 802 is of the charge sensitive variety. The charge pulse generated by the two or more particle detectors 10, 50, 60, 100, 200, 300, 400 flows to pre-amplifier 802 via the AC coupling capacitor 804. Also, in this embodiment, the bias voltage is supplied through a shared pullup resistor 806. The particle detectors 10, 50, 60, 100, 200, 300, 400 connected in parallel, as shown in FIG. 16, have a uniform bias voltage, but the effective capacitance is the sum of all devices connected in parallel. Also, it should be noted that, while two particle detectors 10, 50, 60, 100, 200, 300, 400 are depicted, additional particle detectors can be added to the assembly to increase the overall detector area.

Figure 17:
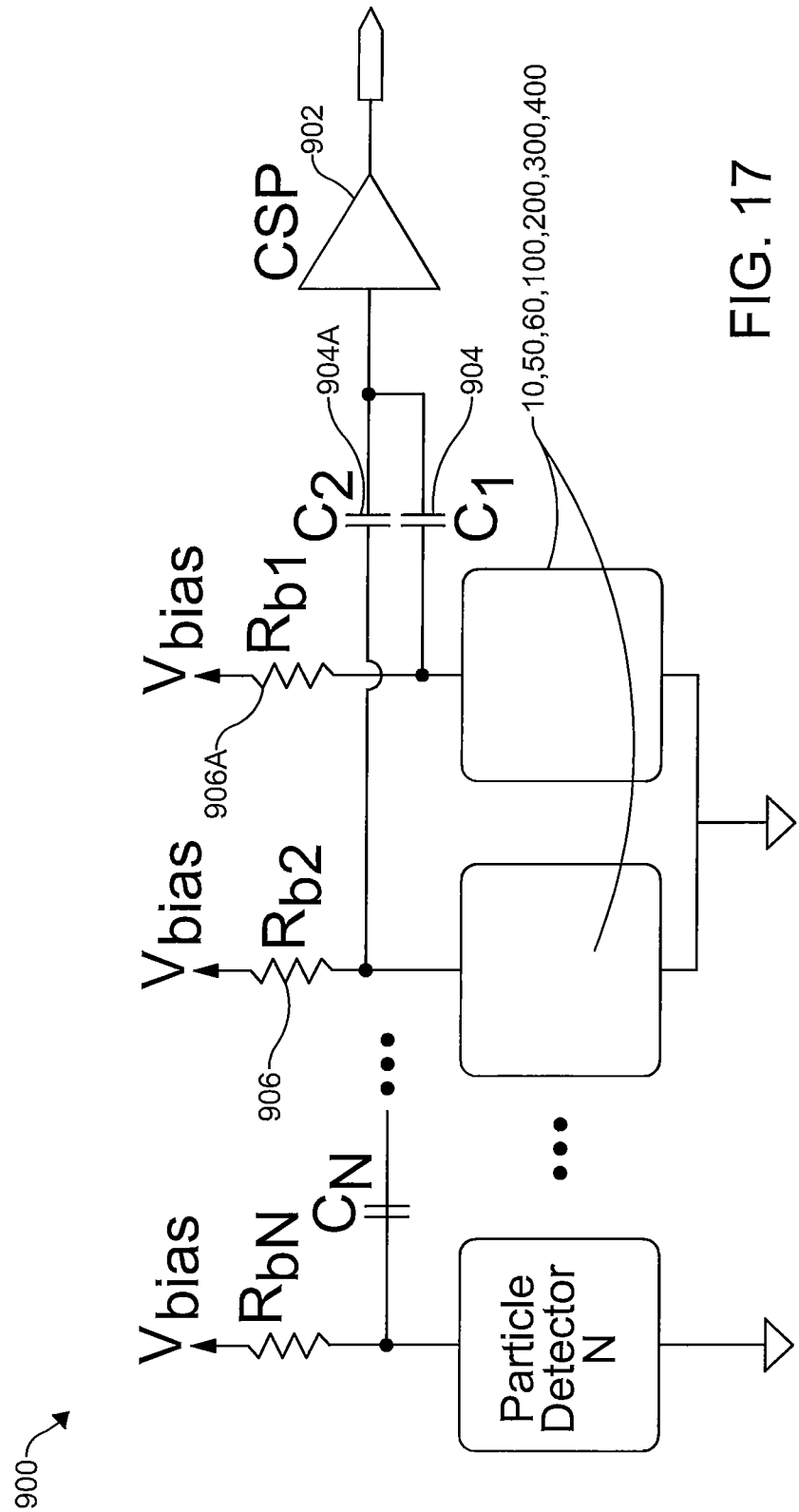
FIG. 17 is an electrical schematic diagram of another embodiment of a particle detector assembly in accordance with the invention.

Both series and parallel embodiments are limited by the characteristics of the worst performing particle detector. In order to mitigate the problems associated with series and parallel connections, in certain embodiments, the particle detector assembly 900 may be provided in a pseudo-parallel configuration as is illustrated in FIG. 17. In this embodiment, each particle detector 10, 50, 60, 100, 200, 300, 400 is independently biased with a corresponding pullup resistor 906, 906A and is AC coupled to the pre-amplifier 902, preferably, of the charge sensitive variety, via a corresponding AC coupling capacitor 904, 904A. Also, in this embodiment, the value of each pullup resistor 906, 906A is matched to the characteristics of the particle detector 10, 50, 60, 100, 200, 300, 400 it is in communication with to maximize the performance of the assembly. In this embodiment, the DC bias and transient current pathways are localized to each particle detector 10, 50, 60, 100, 200, 300, 400 so that cross-communication between detectors is minimized. Also, it should be noted that, while two particle detectors 10, 50, 60, 100, 200, 300, 400 are depicted, this embodiment allows for easy integration of one or more additional particle detectors and their corresponding AC coupling capacitor and pullup resistor into the assembly 900.

Figure 18:
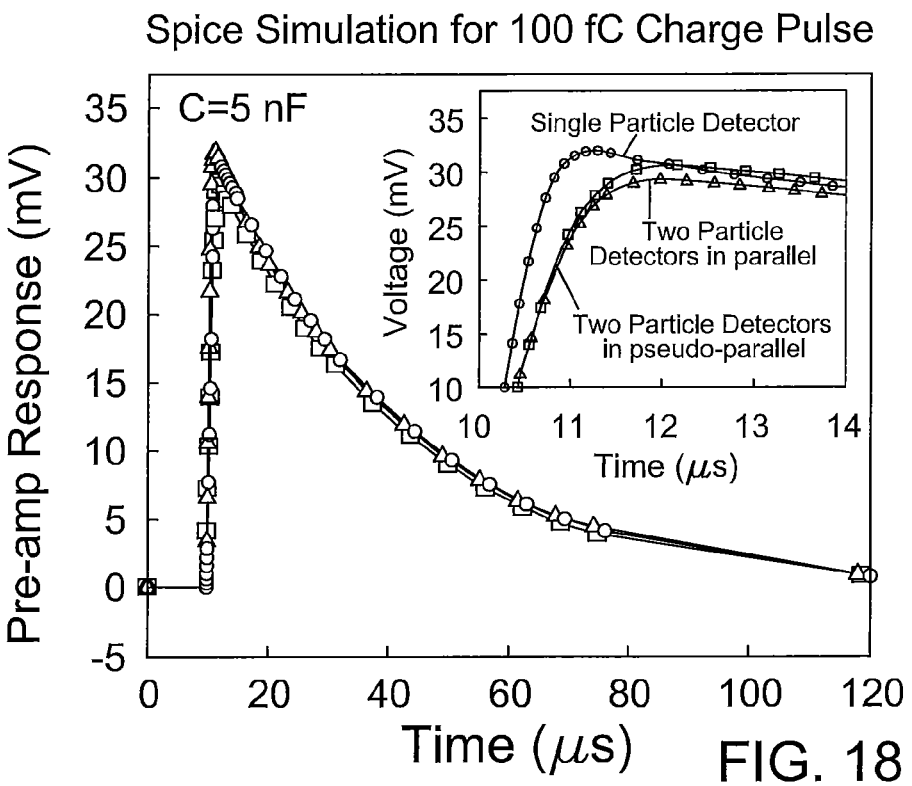
FIG. 18 is a graph of preamp response versus time illustrating SPICE simulation results for certain embodiments the of the particle detector assembly.
Figure 19:
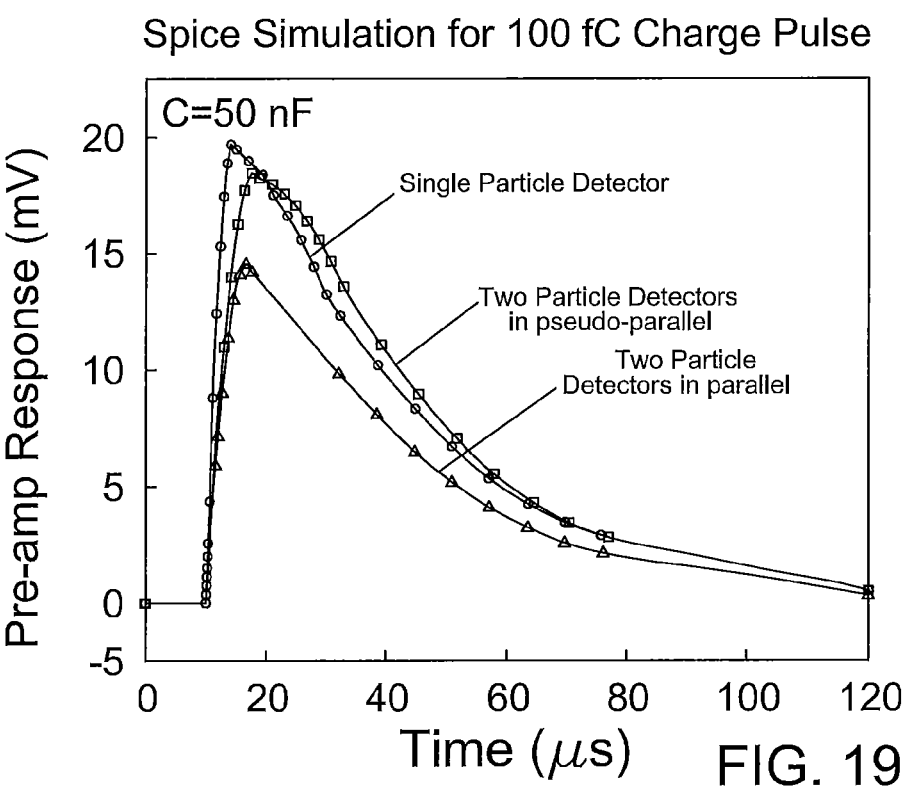
FIG. 19 is a graph of preamp response versus time illustrating SPICE simulation results for certain embodiments the of the particle detector assembly.

FIGS. 18 and 19 illustrate the results of Spice (Simulation Program with Integrated Circuit Emphasis) simulations for particle detectors with two different capacitances (5 nF and 50 nF) in single, parallel, and pseudo-parallel configurations. The preamplifier output for a 100 fC charge, produced by a 10 µA pulse with a 10 ns collection time, applied to one detector is also simulated. As illustrated by FIG. 18, for the single particle detector with the low capacitance (5 nF) has the highest gain followed by the pseudo-parallel setup with a slight performance increase over the parallel setup for two particle detectors with 5 nF capacitance. However, as illustrated in FIG. 19, a substantially enhanced performance increase for pseudo-parallel over the parallel setup occurs for two detectors with 50 nF capacitance. It is important to note that the pseudo-parallel configuration permits independent choice of pullup resistors to match the shunt-resistance characteristics of the corresponding particle detector.

Figure 20:
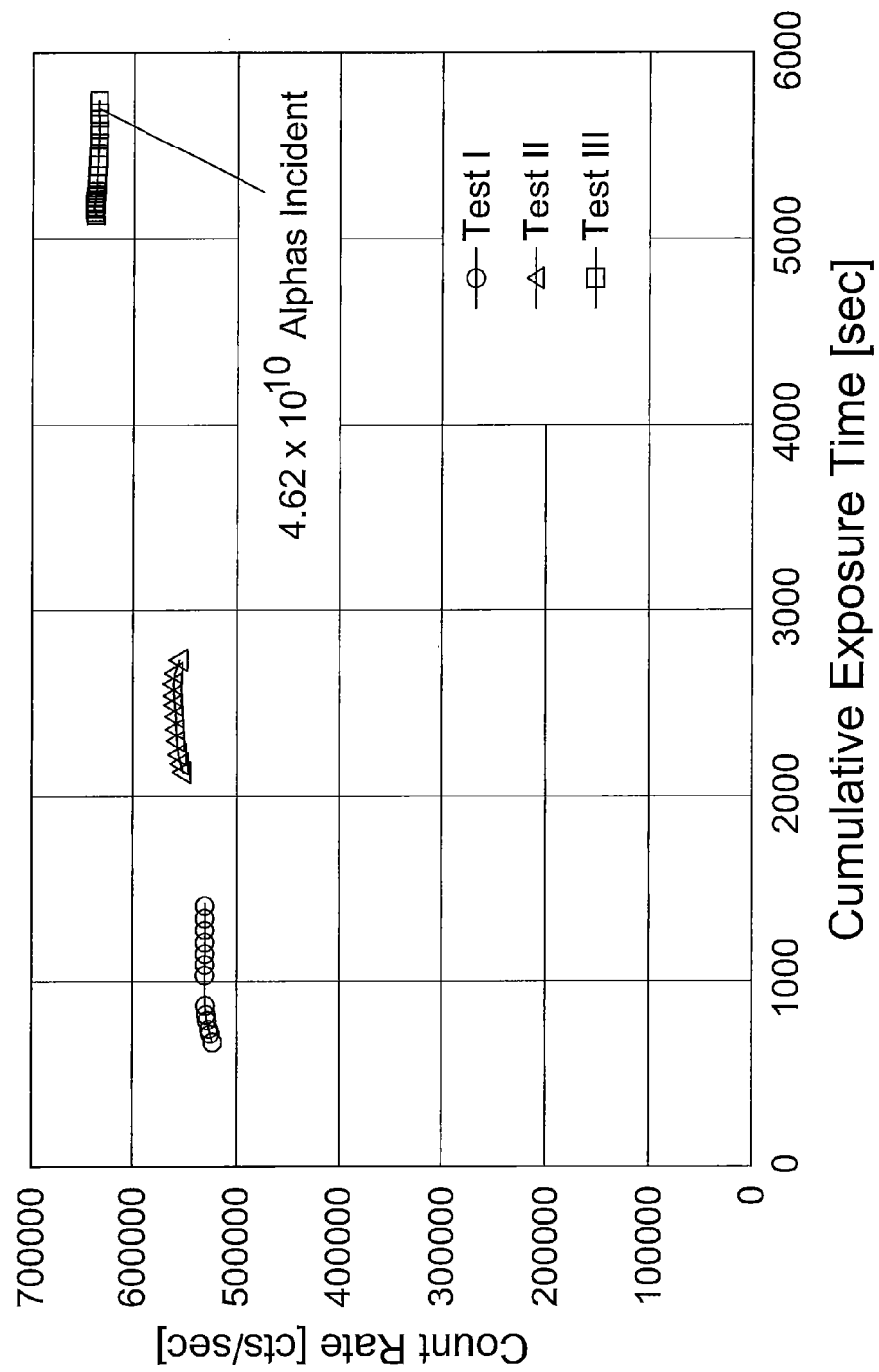
FIG. 20 is a graph of count rate versus exposure time for certain embodiments of the particle detector exposed to high fluxes of alpha particles at 5.5 MeV.

The embodiments of the particle detectors 10, 50, 60, 100, 200, 300, 400 described herein have particular advantages over other known detectors such as, for example, proportional counters and Geiger tubes in situations requiring high speed charged particle and neutron counting. One particular application for the embodiments of the particle detector is neutron multiplicity counting where very high fluxes of neutrons are encountered. Advantageously, the particle detectors have pulse rise times of 100 nanoseconds or less. Furthermore, the particle detector embodiments described above are of robust construction to radiation damage. For example, as illustrated in FIG. 20, the embodiments of the particle detector show no evidence of radiation induced degradation for a total fluence of $4.6 \times 10^{10}$ alpha particles with energies of about 5 MeV.

Also, the embodiments of the particle detector assembly may be non-imaging. Alternatively, the particle detector assembly can be configured as an array to provide spatial sensitivity and imaging. In embodiments where the particle detector assembly is imaging and spatially sensitive, several layers of arrays can be assembled to allow the particle detector data to be analyzed to determine the direction of the incoming particle or neutron. This feature can help to locate a source of particles such as, for example, special nuclear material. In addition, spatial sensitivity may enable certain embodiments of the particle detector assembly to be utilized as a beam profiling instrument in a neutron reactor and in other high energy particle accelerator systems. In the imaging and non-imaging embodiments, the sensitivity of the particle detector assembly can be selected to detect charged particles over large areas to achieve a low detection threshold and to discriminate against gamma radiation.

The particle detectors described above detect particles generated by sources of particles. When particles are received in the semiconductor junction from a source of particles, electron-hole pairs are formed in the semiconductor junction. An energetic charged particle that enters the semiconductor junction through the back electrode layer will generate a track of 100,000 or more electron-hole pairs.

FIGS. 14-15 show the flow of the electrons through a portion of an embodiment of a series connected particle detector. Holes, which are positively charged, flow counter to the electron flow. In this embodiment, the electron-hole pairs are separated utilizing an electric field provided by the semiconductor junction. Electrons of the electron-hole pairs are collected at the front electrode layer and holes of the electron-hole pairs are collected at the back electrode layer. From the front electrode layer, the electrons flow to the first contact electrode or the negative electrode. From the back electrode layer, the holes flow to the second contact electrode or the positive electrode. A pulsed signal is produced which indicates that particles are located in or have passed through the semiconductor junction. The pulsed signal flows from the contact electrodes into a circuit in electrical communication with the particle detector.

To detect neutrons, the particle detector is provided adjacent a source of neutrons. The source of neutrons may be a fissionable material such as plutonium-239, enriched uranium (U-235) or another neutron source. As noted above, thermal neutrons react with the neutron activation layer to generate alpha particles (He-4 nuclei) and tritons (H-3 nuclei) according to the following:

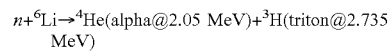

$$n + {}^6Li \rightarrow {}^4He(alpha@2.05\ MeV) + {}^3H(triton@2.735\ MeV)$$

A neutron reacting with the neutron activation layer is followed by an emission of an alpha particle and a triton. The alpha particle and triton are oppositely directed. Due to the typically low energy of the neutron(s), the particles are created with velocities in opposite directions (equal and opposite momenta). The particles entering the semiconductor junction, preferably a heterojunction of CdS and CdTe, create ionization in the form of electron-hole pairs in the CdTe layer. Neutron absorption by the neutron activation layer is indicated when one, or both, of the alpha particle and triton create ionization in the semiconductor junction. In order to be detected, the alpha particle and/or the triton must enter the CdTe layer with enough energy to create ionization. Also, as described above, the electron-hole pairs are separated into electrons and holes by the electric field provided by the heterojunction junction and create a pulsed signal.

The foregoing description is considered as illustrative only of the principles of the invention. Further, since numerous modifications and changes will readily occur to those skilled in the art, the invention may not be limited to the exact construction and processes shown and described herein. Accordingly, all suitable modifications and equivalents may be considered as falling within the scope of the invention.

The invention claimed is:

1. A particle detector, comprising:
   a support member;
   a front electrode layer disposed over the support member;
   a semiconductor heterojunction having at least a polycrystalline n-type layer and at least a polycrystalline p-type layer, the semiconductor heterojunction disposed over the front electrode layer;
   a back electrode layer disposed over the semiconductor heterojunction, the back electrode comprising at least one removed portion that separates a first portion of the back electrode layer from a second portion of the back electrode layer; and
   a first body of electrically insulating material which separates a first portion of the semiconductor heterojunction from a second portion of the semiconductor heterojunction and a first portion of the front electrode layer from a second portion of the front electrode layer.

2. The particle detector of claim 1, wherein the polycrystalline n-type layer is CdS and the polycrystalline p-type layer is CdTe.

3. The particle detector of claim 1, further comprising a neutron activation layer disposed over the back electrode layer, wherein the neutron activation layer comprises a material which has a thermal neutron absorption cross section of 500 barns or more.

4. The particle detector of claim 1, further comprising a first high resistivity buffer layer disposed directly on the front electrode layer and/or a second high resistivity buffer layer disposed directly on the semiconductor heterojunction, wherein, when the first high resistivity buffer layer is disposed directly on the front electrode layer, the first body of electrically insulating material separates a portion of the first high resistivity buffer layer from another portion of the first high resistivity buffer layer and, when the second high resistivity buffer layer is disposed directly on the semiconductor heterojunction, the first body of electrically insulating material separates a portion of the second high resistivity buffer layer from another portion of the second high resistivity buffer layer.

5. The particle detector of claim 1, wherein the first body of electrically insulating material is in a parallel, spaced apart relationship with the at least one removed portion.

6. The particle detector of claim 1, further comprising a second body of electrically insulating material, wherein the at least one removed portion is positioned between the first body of electrically insulating material and the second body of electrically insulating material.

7. The particle detector of claim 1, further comprising a first contact electrode in electrical communication with the top electrode layer and a second contact electrode in electrical communication with the back electrode layer.

8. The particle detector of claim 1, wherein the first portion of the back electrode layer is disposed over the first body of electrically insulating material.

9. The particle detector of claim 1, wherein the first portion of the semiconductor heterojunction, the first portion of the front electrode layer and the first portion of the back electrode layer are in electrically connected in series with the second portion of the semiconductor heterojunction, the second portion of the front electrode layer and the second portion of the back electrode layer.

10. The particle detector of claim 2, wherein at least one of the polycrystalline CdS layer and the polycrystalline CdTe layer is depleted of Cd-113 isotope.

11. The particle detector of claim 3, further comprising a diffusion barrier disposed between the neutron activation layer and the back electrode layer.

12. The particle detector of claim 6, wherein the first portion of the back electrode layer is disposed on a portion of the second portion of the front electrode layer.

13. The particle detector of claim 7, wherein the first contact electrode is disposed over a portion of the support member and the second contact electrode is disposed over another portion of the support member.

14. The particle detector of claim 11, wherein the diffusion barrier is a polymeric or metallic member.

15. The particle detector of claim 11, wherein the diffusion barrier is a space filled with a gas or is evacuated.

16. A particle detector assembly comprising two or more of the particle detectors of claim 1, wherein the particle detectors are electrically connected in series, parallel, or in a pseudo-parallel configuration.

* * * * *